United States Patent
Aoyama et al.

(10) Patent No.: US 8,730,382 B2
(45) Date of Patent: May 20, 2014

(54) CHARGE ACCUMULATING AND SPLITTING IMAGING DEVICE

(75) Inventors: Chiaki Aoyama, Saitama (JP); Shoji Kawahito, Shizuoka (JP)

(73) Assignees: Honda Motor Co., Ltd., Tokyo (JP); Shizuoka University, Shizuoka (JP)

( * ) Notice: Subject to any disclaimer, the term of this patent is extended or adjusted under 35 U.S.C. 154(b) by 579 days.

(21) Appl. No.: 12/995,913

(22) PCT Filed: Jun. 4, 2009

(86) PCT No.: PCT/JP2009/002537
§ 371 (c)(1),
(2), (4) Date: Dec. 2, 2010

(87) PCT Pub. No.: WO2009/147862
PCT Pub. Date: Dec. 10, 2009

(65) Prior Publication Data
US 2011/0090385 A1 Apr. 21, 2011

(30) Foreign Application Priority Data
Jun. 4, 2008 (JP) .................................. 2008-147308

(51) Int. Cl.
*H04N 5/335* (2011.01)
*G02B 7/40* (2006.01)

(52) U.S. Cl.
USPC ..................... 348/370; 348/229.1; 348/230.1; 348/316

(58) Field of Classification Search
USPC ....................................... 250/208.1; 356/5.01
See application file for complete search history.

(56) References Cited

U.S. PATENT DOCUMENTS 5,705,807 A * 1/1998 Throngnumchai et al. .......................... 250/214 P 5,754,280 A * 5/1998 Kato et al. .................... 356/3.06
(Continued)

FOREIGN PATENT DOCUMENTS

EP 1 777 747 A1 4/2007
JP 08-122149 5/1996
(Continued)

OTHER PUBLICATIONS

European Search Report for corresponding European Application No. 09 758 129.2 dated Dec. 9, 2013.

*Primary Examiner* — Twyler Haskins
*Assistant Examiner* — Dwight C Tejano
(74) *Attorney, Agent, or Firm* — Squire Sanders (US) LLP

(57) ABSTRACT

Charge generated in a photodiode is properly split for difference processing. An imaging element is constituted by a semiconductor such that a charge accumulation portion is connected to a light receiving portion using a buried photodiode and charge is split from the charge accumulation portion by a plurality of gates and is accumulated. An imaging device includes a control device performing control so as to accumulate charge that is generated by a photoelectric conversion at an exposure cycle synchronous with the light emission of a light source. The exposure cycle includes a first period for receiving reflection light from a subject illuminated by light from the light source and a second period for receiving light from the subject illuminated by an environmental light not including the light from the light source. The imaging device includes a charge accumulation region connected to each photoelectric conversion region, a first charge storage region for receiving charge generated in the photoelectric conversion regions during the first period via the charge accumulation portion, and a second charge storage region for receiving charge generated in the photoelectric conversion regions during the second period via the charge accumulation portion.

15 Claims, 32 Drawing Sheets

(56) References Cited

U.S. PATENT DOCUMENTS

| | | |
|---|---|---|
| 6,239,456 B1 | 5/2001 | Berezin et al. |
| 6,501,506 B1 | 12/2002 | Miura |
| 7,645,974 B2 * | 1/2010 | Ikeno et al. ............... 250/205 |
| 7,834,305 B2 * | 11/2010 | Hagio et al. ............ 250/214 R |
| 2004/0195493 A1 * | 10/2004 | Hashimoto et al. ...... 250/214 R |
| 2005/0145773 A1 * | 7/2005 | Hashimoto et al. ...... 250/203.6 |
| 2006/0192938 A1 | 8/2006 | Kawahito |
| 2007/0146539 A1 * | 6/2007 | Kawahara et al. ............ 348/370 |
| 2007/0158770 A1 | 7/2007 | Kawahito |
| 2010/0141769 A1 * | 6/2010 | Kato ............................ 348/164 |

FOREIGN PATENT DOCUMENTS

| | | |
|---|---|---|
| JP | 10-322599 | 12/1998 |
| JP | 2006-155422 | 6/2006 |
| JP | 2008-060621 | 3/2008 |

\* cited by examiner

Generated Charge

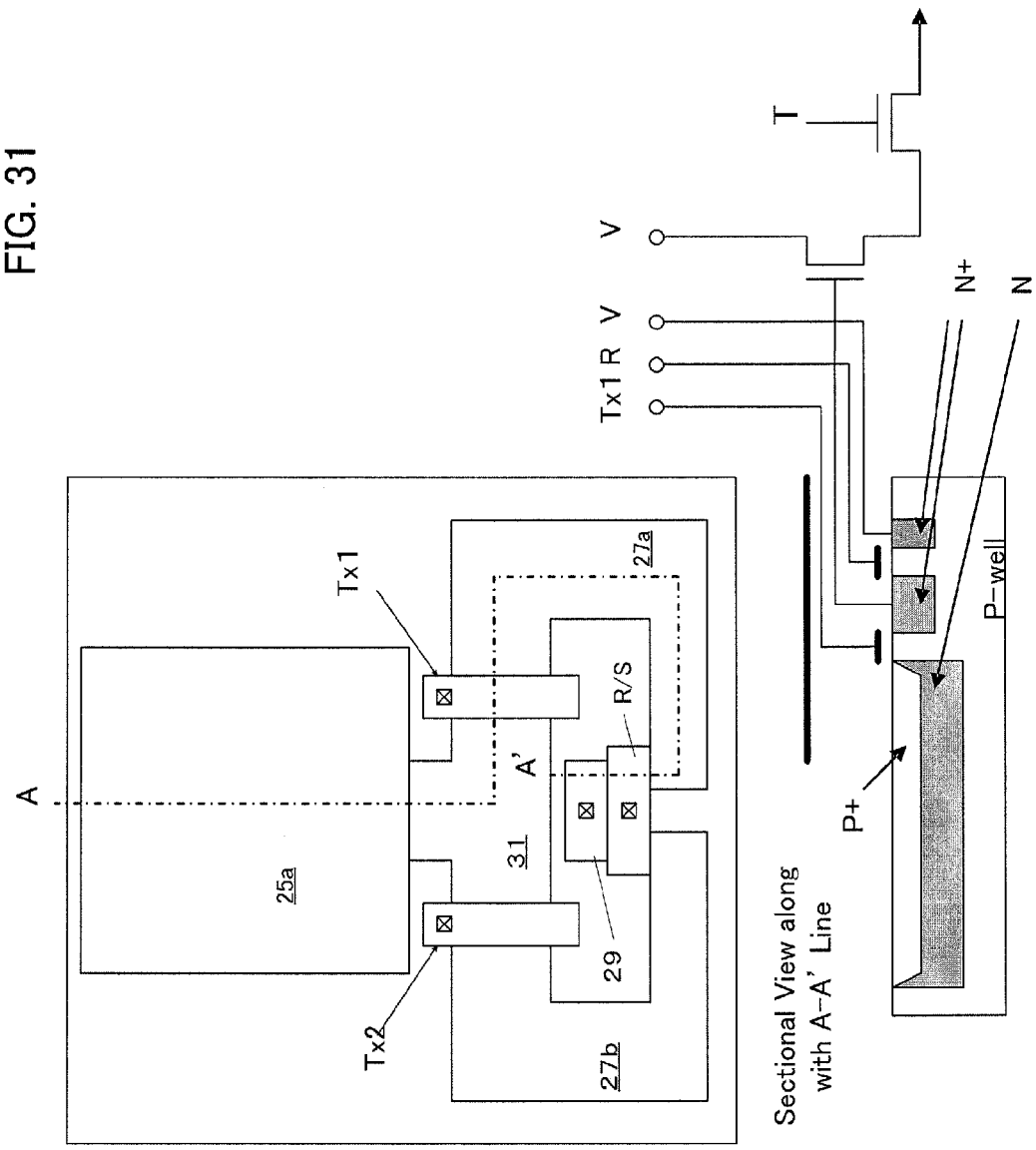

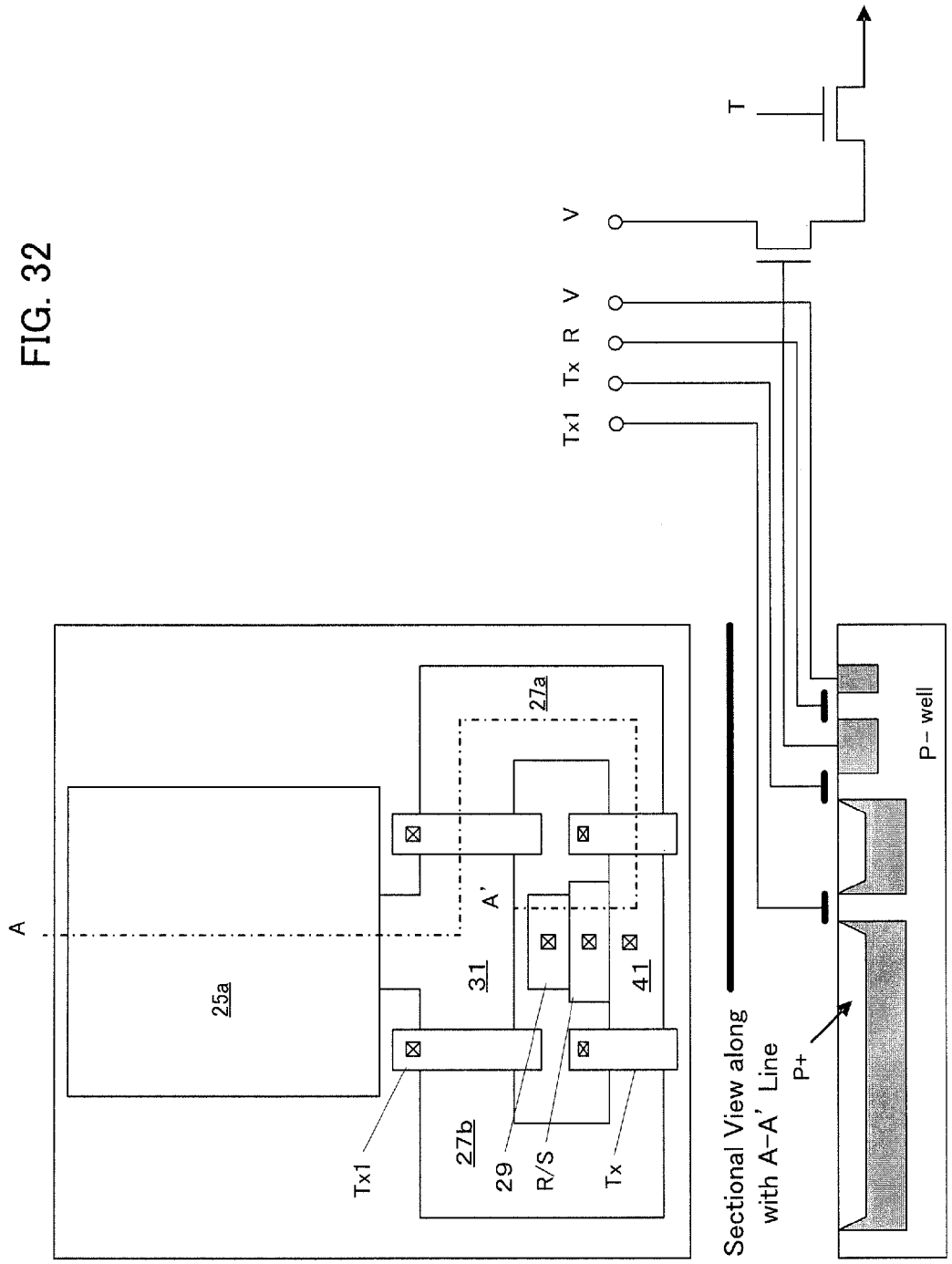

CHARGE ACCUMULATING AND SPLITTING IMAGING DEVICE

TECHNICAL FIELD

This invention relates to an imaging device generating an image without influence by environmental light.

BACKGROUND ART

Conventional art has a problem that, when an object is recognized via an imaging device, performance of recognition is not high, since lighting condition varies in wide rage under natural environmental light. By using artificial light, performance of recognition is improved, the influence by the natural environmental light, especially the sunshine, is still required to be eliminated.

Japanese patent application publication No. 2006-155422 describes that an image is generated and recognized by differentiation between an output of a light detector when a light source does not illuminate a subject space and an output of the light detector when the light recourse illuminates the subject space.

U.S. Pat. No. 6,239,456 describes that a light source emits a pulse of light, and, charge generated by a light incident from a view is split into plural capacitors connected via split gates to photo diodes in synchronous with the emission of the light. It is also described that signal processing is applied to this charge stored in the plural capacities, output waveforms corresponding to the pulse emission of the light source is extracted, and a distance up to a subject is measured based on the phase differentiation among the output waveforms.

A quantity of charge sampled at one time will be significantly decreased as a ratio of light emission is increased. If a light incident has a non-uniform peak, especially if such peak is located close the split gate, the quantity of charge is changed in accordance with the capacitor to which the charge transferred by the split gate.

Japanese patent application publication No. H02-304974 describes the structure and the manufacturing method of a buried photo diode. On the N type region 6 (FIG. 1(e)) of the photo diode on the substrate, the P type region 13 is formed, and the N type photo diode 6 is buried (FIG. 1(f)). The electric charge generated in the photo diode 6 is, by means of the silicon gate as a transfer gate, transferred to N type region 7 as an electric charge transfer portion.

Document No. 1: Japanese Published Patent Application 2006-155422
Document No. 2: U.S. Pat. No. 6,239,456
Document No. 3: Japanese Published Patent Application H02-304974

DISCLOSURE OF THE INVENTION

Problem to be Solved by the Invention

Therefore, the technique to properly split charge is required.

Means to Solve the Problem

In order to solve the problem, an imaging element according to this invention is constituted by a semiconductor such that a charge transfer portion is connected to a light receiving portion comprised of one or more than one buried photo diodes, and the charge is split by plural gates and accumulated.

An imaging device according to this invention includes a light source emitting a light at a given cycle, and a light receiving portion having a pixel unit array for photoelectric conversion for light received from a view. This imaging device includes a control device performing control so as to accumulate electric charge that is generated by photoelectric conversion at an exposure cycle in synchronous with light emission of the light source. The exposure cycle includes a first period for receiving reflection light from a subject illuminated by the light source, and a second period for receiving reflection light from subject illuminated by an environmental light not including the light from the light source.

This imaging device also includes a charge transfer portion connected to each of photoelectric conversion portions in the light receiving portion, a first charge storage region for receiving charge generated in the photoelectric conversion portions during the first period via the charge transfer portion, and a second charge storage region for receiving charge generated in the photoelectric conversion portions during the second period via the charge transfer portion.

According to one of embodiments of this invention, the first and second charge storage regions are structured to integrate charge generated in each photoelectric conversion portion of the light receiving portion during n time exposures. The imaging device includes a differential circuit which, after nth time exposure, extracts charge from the first and second charge storage regions, and measuring difference between the charges.

According to one of the embodiments of this invention, the imaging device generates an image without interference by environmental light, based on the difference.

According to another embodiment of this invention, the imaging device calculates a distance up to a subject based on the phase difference between the signal obtained by the difference and the light of the source.

According to an embodiment of this invention, each of the pixels in light receiving portion is divided to small photoelectric conversion portions, and, each of these small photoelectric conversion portions is commonly connected to the charge transfer portion.

And, the first and second charge storage regions are common to said small photoelectric conversion portions for each of the pixels.

According to an embodiment of this invention, charge transfer portion is connected to a drain electrode via a drain gate, so that, at rising edge, and or, at falling edge of the light, charge accumulated at the charge transfer portion is drained by opening the drain gate.

According to an embodiment of this invention, the light receiving portion is fabricated by a buried photo diode, and each of the pixels is connected to said charge transfer portion via a transfer gate.

According to an embodiment of this invention, a micro lens may be provided in front of a light receiving surface of a photo diode.

And, a charge storage region may be fabricated by a MOS capacitor.

According to an embodiment of this invention, a charge storage region is connected to a read out charge storage region, via a read out transfer gate.

A charge transfer portion is connected to a drain electrode via a drain gate. An imaging device is configured to drain the charge accumulated at said charge transfer portion by opening the drain gate, at rising edge of the light, and, or, at the falling edge of the light.

BRIEF DESCRIPTION OF DRAWINGS

FIG. 31 shows a structure of a pixel unit of a further alternative embodiment of this invention, wherein a first charge storage region and a second charge storage region are connected to a common reset electrode.

FIG. 32 shows a structure of a pixel unit of a further alternative embodiment of this invention, wherein a common read out portion 41 is provided.

BEST MODE OF CARRYING OUT THE INVENTION

Figure 1:
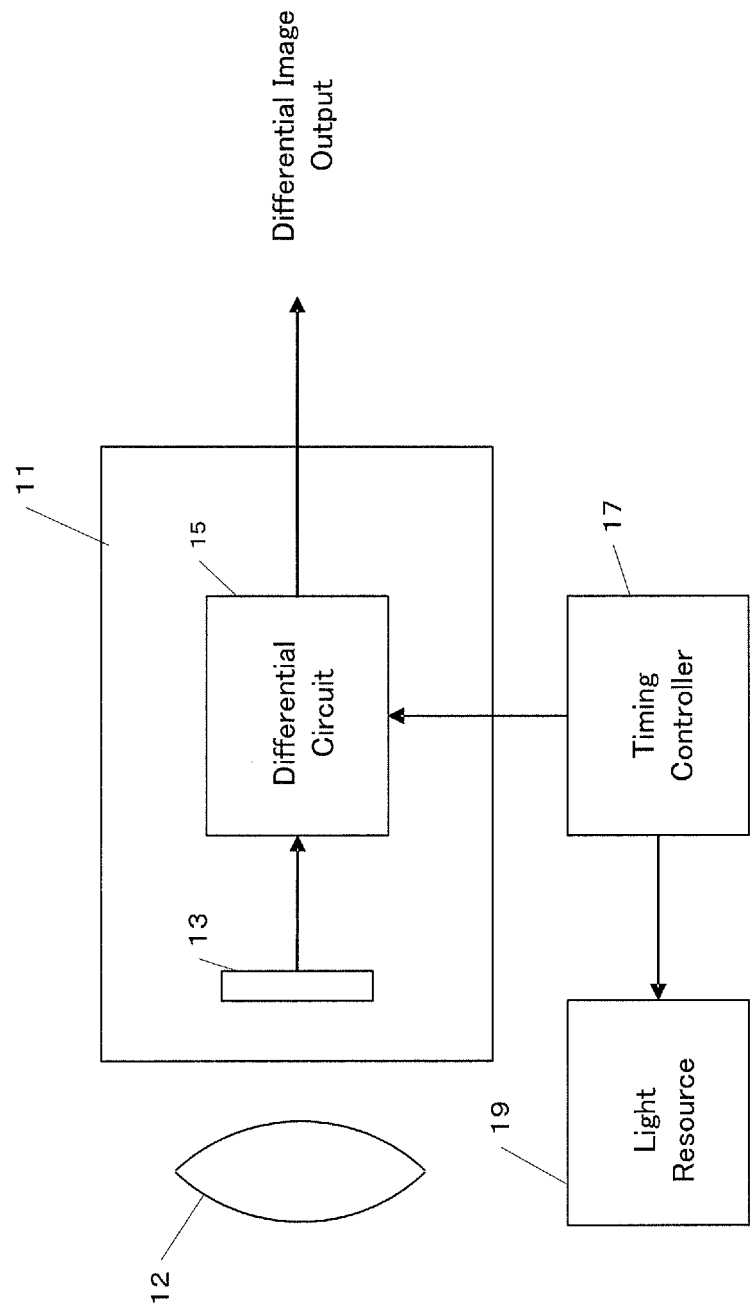
FIG. 1 is a block diagram of a fundamental architecture of an imaging device to which this invention is adopted.

Hereinafter, embodiments of this invention are described referring the drawings. FIG. 1 shows a fundamental structure of a system of generating a differential image, which this invention is based on. A camera 11 includes a light receiving portion 13 for receiving light via a lens 11 from a subjecting space, and a differential circuit 15 for generating a differential image output. A timing controller 17 controls a timing of a light emission by a light projector 19 and a timing of extracting charge from a light receiving portion.

Figure 2:
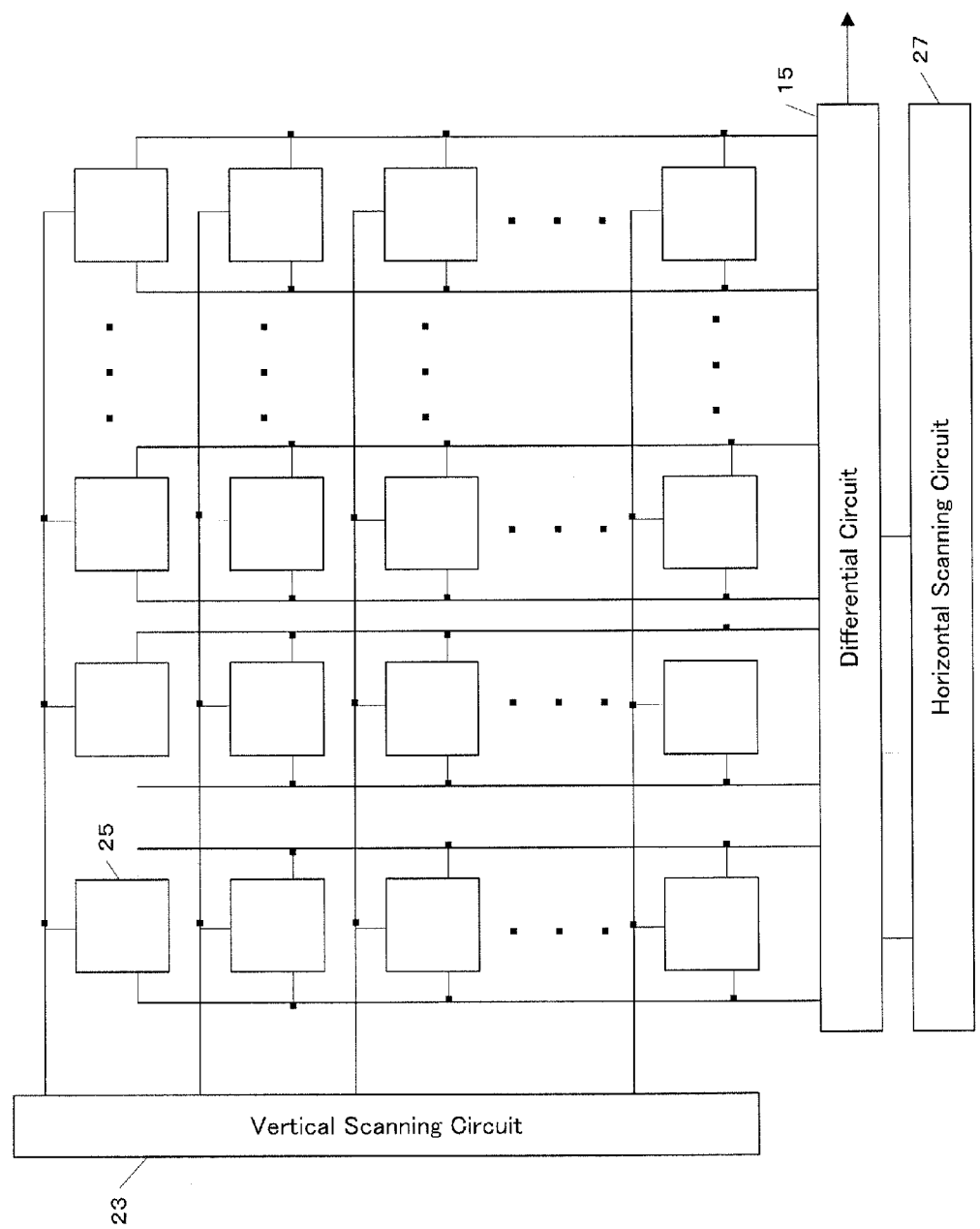
FIG. 2 shows an example of a pixel unit array of this invention.

FIG. 2 shows an array of pixels 25 in the light receiving portion 13 according to this invention. As described later, for each of the pixels, one exposure, that is synchronous with the light emission, has a first period during which the pixel receives light from the subject illuminated by the light source and a second period during which the pixel receives environmental light not including light from the light source. Each of the pixel unit has a first charge storage region for storing charge generated during the first period by a photoelectric conversion portion, and a second charge storage region for storing charge generated during the second period by the photoelectric conversion portion. A differential circuit 15 reads out charge from each of first and second storage regions, and generates and outputs a differential signal as a differential image output.

Figure 3:
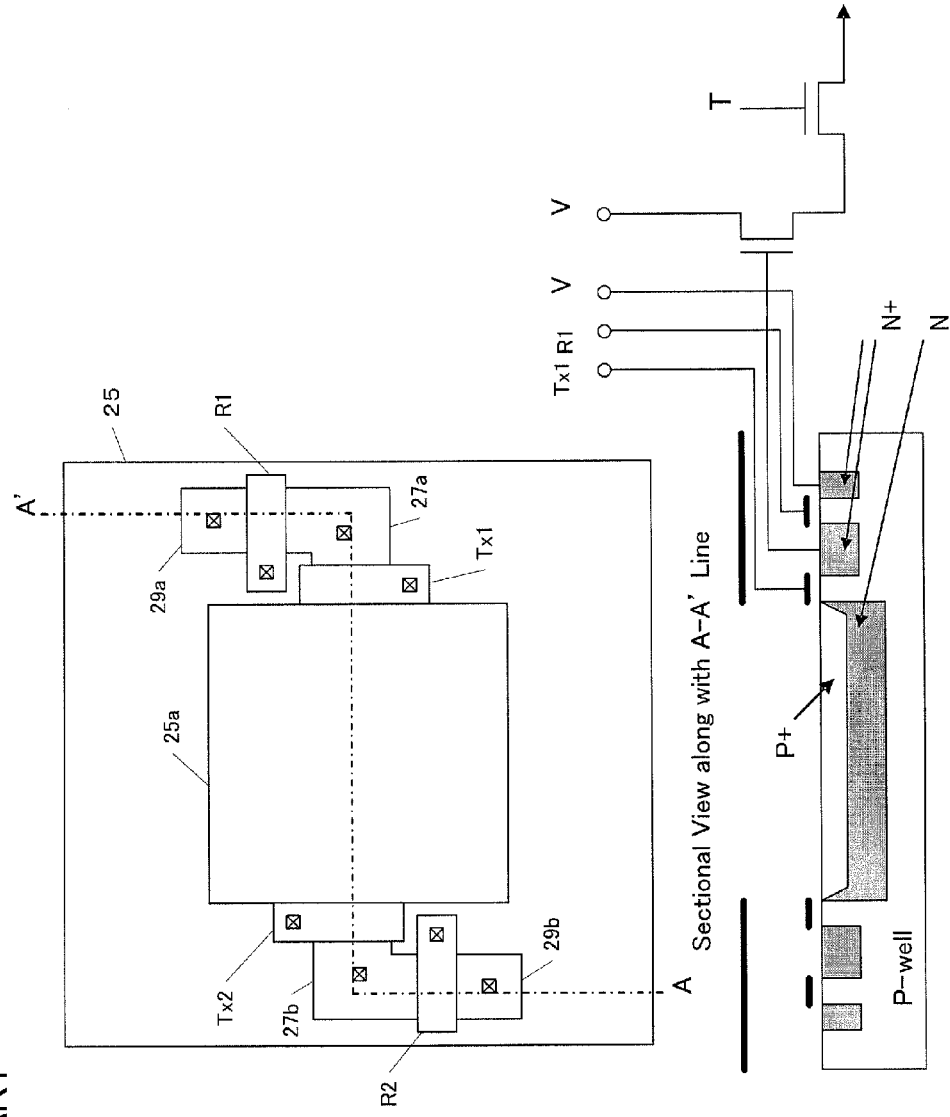
FIG. 3 shows a layout and sectional view of a pixel unit of prior art.

FIG. 3 schematically shows a pixel unit 25 in the light receiving portion, for example, as shown in Document No. 2. A photoelectric conversion portion 25a in the pixel unit 25 is fabricated by a photodiode, is connected to a charge storage region 27a via a split gate Tx1, and is connected to a charge storage region 27b via a split gate Tx2. Each of the charge storage regions 27a, 27b is connected to reset electrodes 29a, 29b, via reset gates Ra, Rb, respectively. The sectional view at lower portion of FIG. 3 shows that the photoelectric conversion portion 25a is formed in a N type region buried in a P type semiconductor substrate. Edge of N type region is depicted in bump shape, as same as edge of the N type region 6 depicted in FIG. 1(f), FIG. 2(e), and FIG. 3(a) of Patent Document No. 3, and is a conventional structure by itself. Charge is transferred from the photoelectric conversion portion 25a to N+ region of the charge storage region 27a, by applying an electric potential to the gate Tx1.

Figure 4:
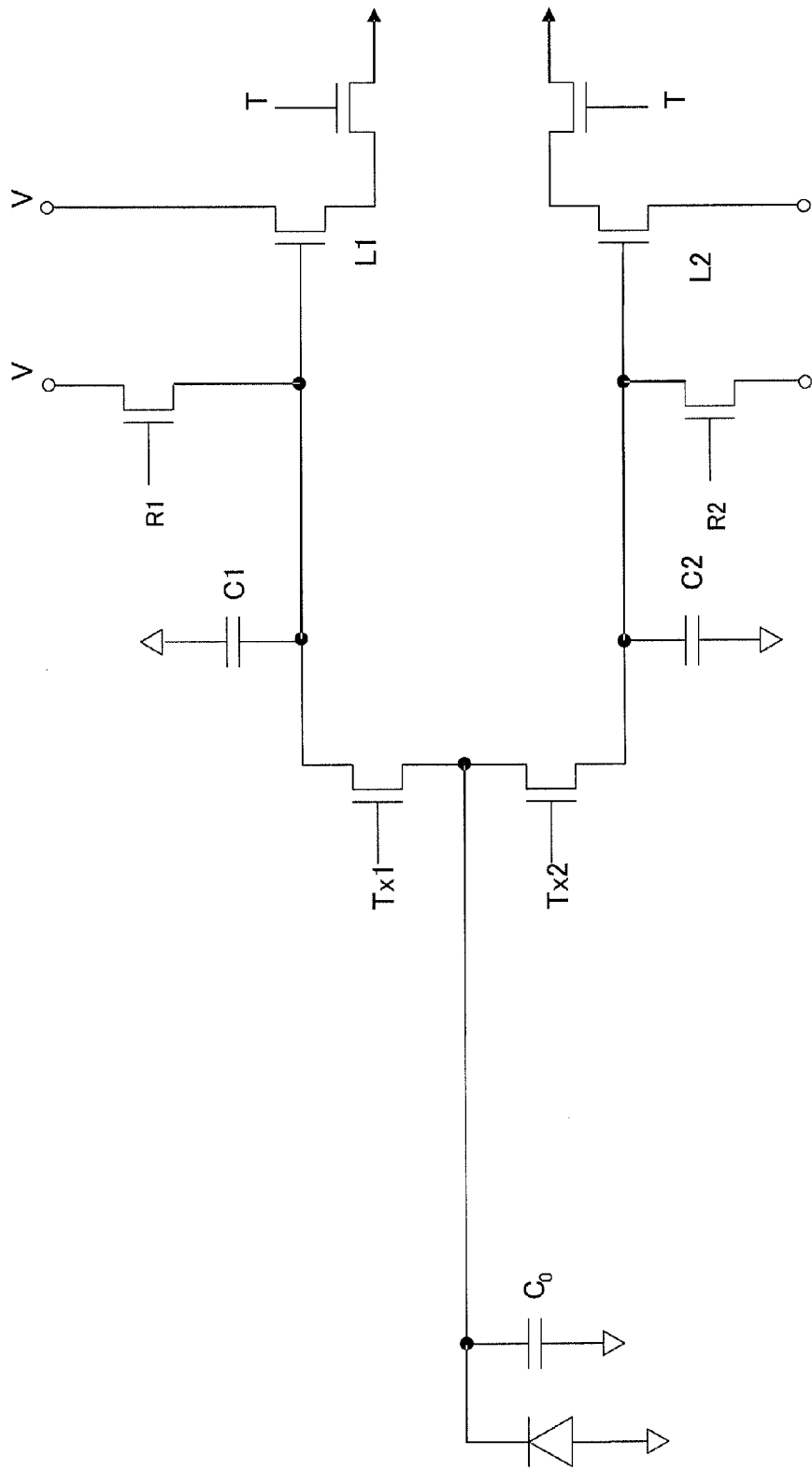
FIG. 4 shows an equivalent circuit diagram of the pixel unit of FIG. 3.
Figure 5:
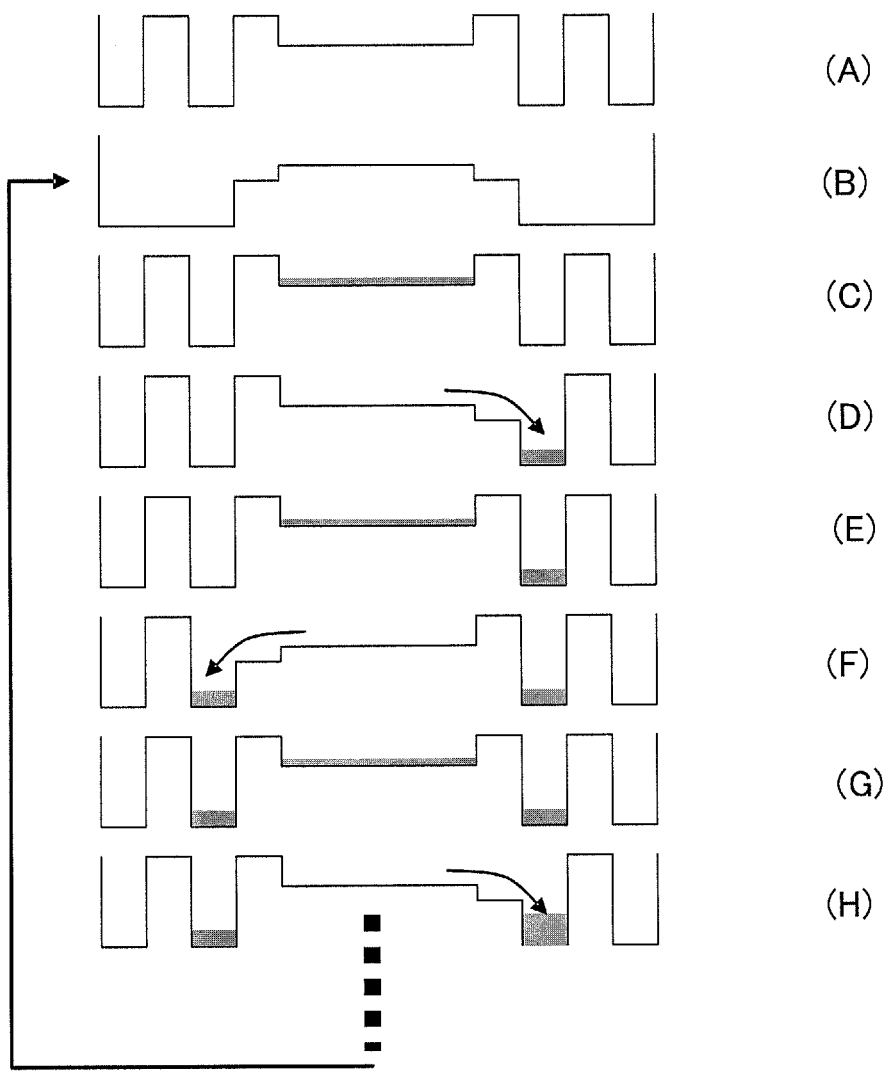
FIG. 5 shows potential transition of the pixel unit of FIG. 3.

FIG. 4 is a circuit diagram of the pixel unit of FIG. 3. FIG. 5 shows the potential well transition in this circuit. The light receiving region 25a, that is, the photoelectric conversion portion 25a is depicted as a diode having photoelectric conversion function and a capacitor C0. FIG. 5(A) shows the potential well under any operation is not applied to the circuit. In FIG. 5(B), when each the split gates Tx1, Tx2 and each the reset gates R1, R2 are opened, a voltage V is applied to the photoelectric conversion portion and the charge storage region so that charge is eliminated. FIG. 5(C) shows a way the charge is generated in the photoelectric conversion portion 25a during the first period. FIG. 5(D) shows a way the charge stored in the photoelectric conversion portion 25a is transferred to the charge storage region 27a (shown as a capacitor C1), by opening the split date Tx1.

Next, FIG. 5(E) shows a way the charge is generated in the photoelectric conversion portion 25a during the second period of the first exposure. FIG. 5(F) shows a way the charge stored in the photoelectric conversion portion 25b is transferred to the charge storage region 27b (shown as a capacitor C2), by opening the split date Tx2. FIG. 5(G) shows the starting of the first period of the second exposure, and FIG. 5(H) shows a way the charge stored in the photoelectric conversion portion is transferred to the capacitor C1 of the charge storage region 27a. Thus, after n times of the exposure cycle, the charge accumulated in the charge storage region 27a (the capacitor C1) and the region 27b (the capacitor C2) are read out by opening the output gate T. FET transistors L1 and L2 are transistors for level sift and work to transfer electric current to a downstream process circuit, in accordance with the level of the capacitor C1 or C2.

Figure 6:
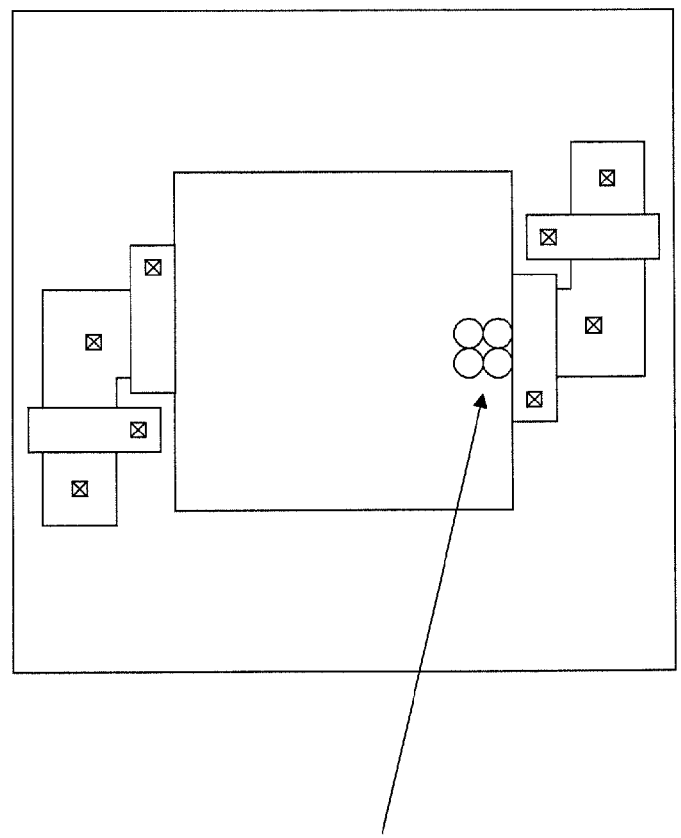
FIG. 6 schematically shows a problem in prior art.

FIG. 6 depicts schematically the problem occurred in the conventional photoelectric conversion portion 25a of the pixel unit 25. Consider a light-emitting diode is used as the light source of the light projector 19, a light projection ratio (a frequency of the cycle) is high, amount of electron is split to the charge storage regions 27a, 27b, via the split gates Tx1, Tx2.

In this situation, at each exposure cycle, the first period during for receiving the light reflected on the subject illuminated by the LED and the second period for receiving the environmental may be lower 1/10 milliseconds order or less, furthermore, a nanosecond order to a microsecond order. Since the number of electron generated in a very small photoelectric conversion region is very small such as a order of several to tens.

In this situation, if a light incidents the edge portion of the photoelectric conversion region, for example, the portion close to the split gate Tx1, the split gate Tx2 is opened in order to store the electrons in the charge storage region 27b, the electrons cannot move to the charge storage region within such a short time. Accordingly, liability regarding the differentiation between the charge stored at the first period and the charge stored in the second period is degraded.

Figure 7:
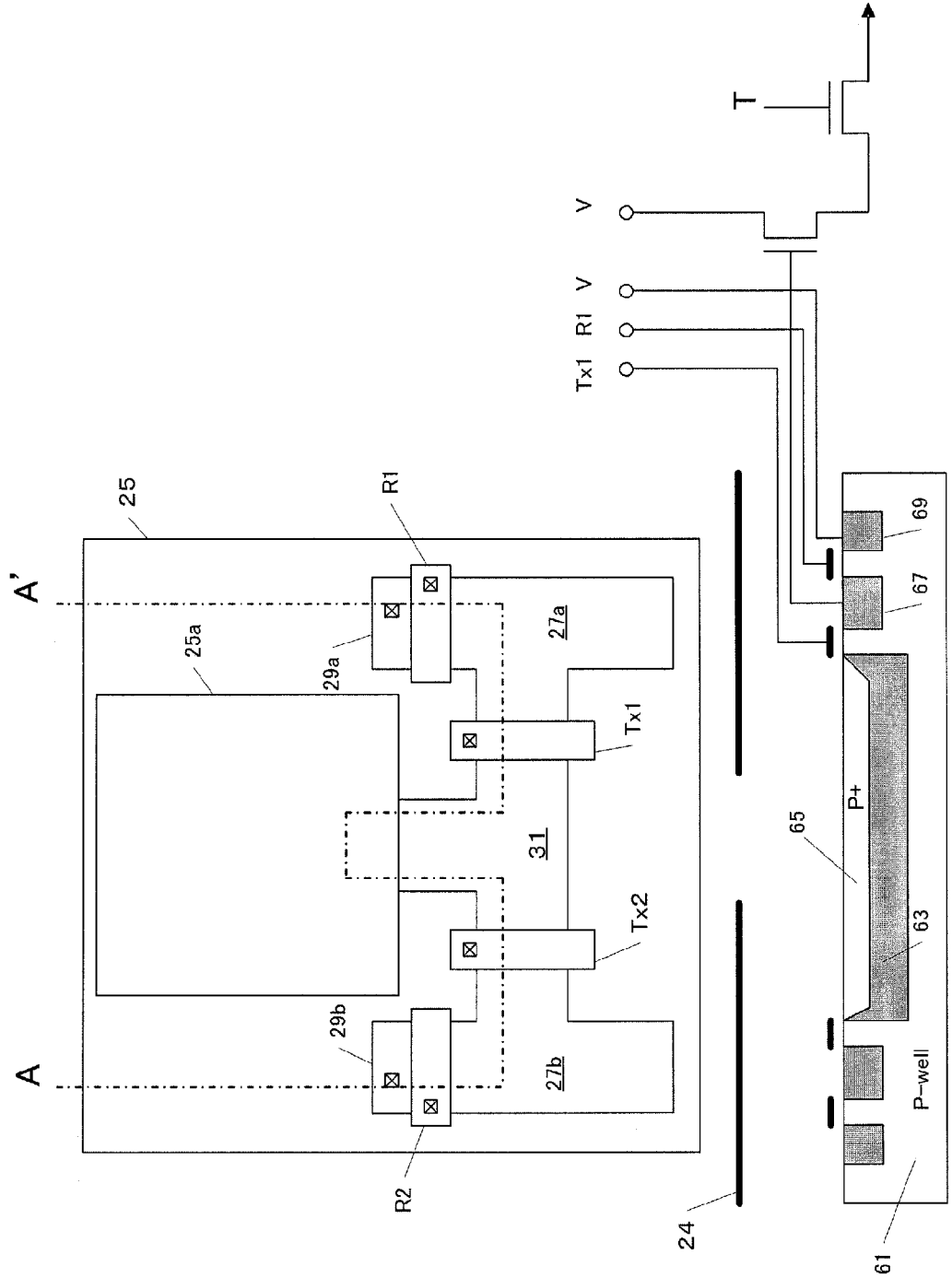
FIG. 7 shows a layout and sectional view of a pixel unit of an embodiment of this invention.

FIG. 7 shows one embodiment of a pixel unit 25 according to this invention to resolve the above mentioned problem. The differentiation from the conventional pixel unit shown in FIG. 3 is in that a charge transfer portion 31 is located close to the photoelectric conversion 25a. In this embodiment, the photoelectric conversion portion 25a has a structure wherein a P type region is provided at the surface of the structure and a N type region is provided under this P type region, and the charge transfer portion 31 is formed by elongated region of the photoelectric conversion portion 25a underneath a blackout curtain 24.

Below of FIG. 7 shows the A-A sectional view of the pixel unit 25. A N type layer 63 is buried in a P type well (P-well) 61, a photo diode is formed by the PN junction between the P-well 63 and a P+ region 65 formed on the P-well 65. This PN junction, except the photoelectric conversion portion 25a, works as a charge transfer portion 31. Charge generated in the photoelectric conversion portion 25a moves into the charge transfer portion that is at lower potential. In order to enhance efficiency of this charge movement, by deferring the doze level of the charge transfer portion from the doze level of the photoelectric conversion portion 25a, gradient of potential can be formed.

The charge storage region 27a is formed adjacent to the transfer gate Tx1 of a MOS structure. The charge storage region 27a is formed by a N type region 67 buried in the P-well 61. A N+ region 69 comprises a reset electrode 29a, and is connected to a wire of voltage V. The N region 67 is electrically connected to the N+ region 69 by applying a voltage to a gate R1 of the MOS structure.

Figure 12:
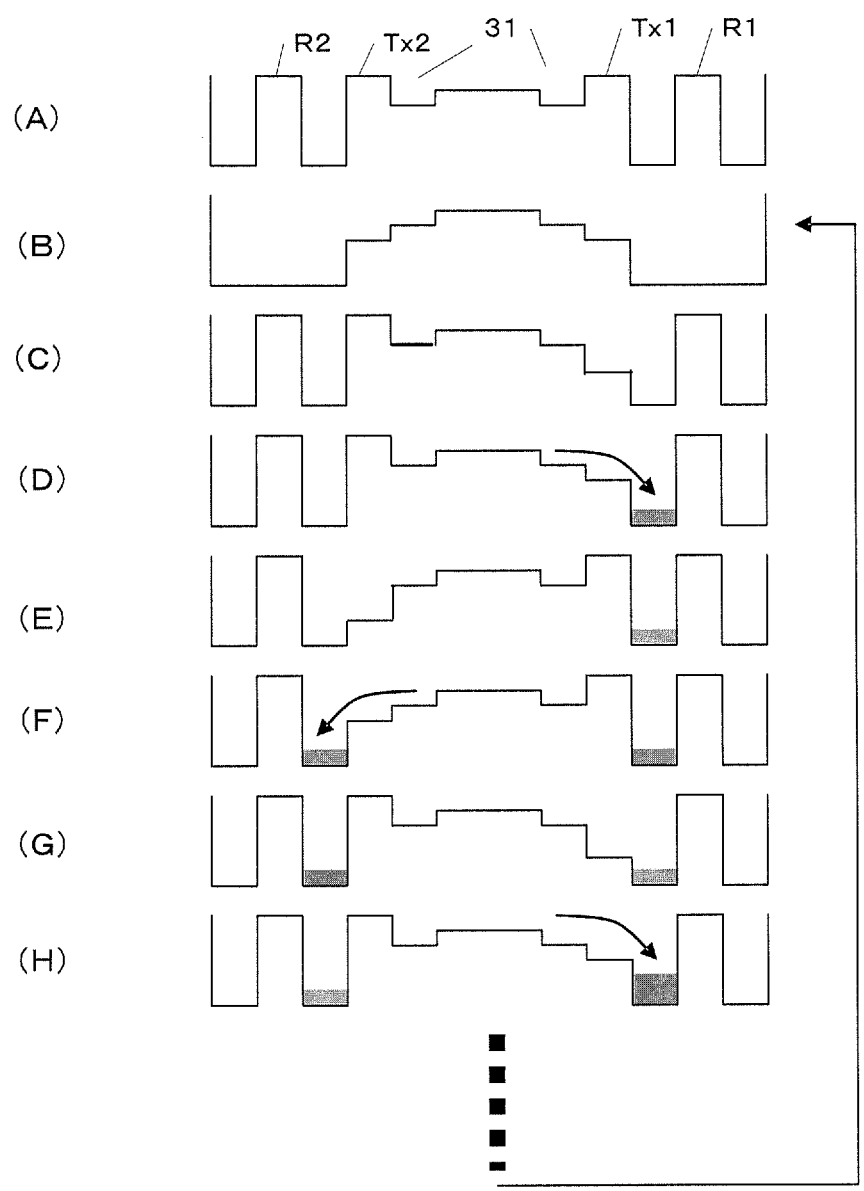
FIG. 12 shows potential transition of the embodiment of this invention.

As shown in FIG. 12, a step in potential is formed between the photoelectric conversion portion 25a and the charge transfer portion 31. This step is formed by varying the doze level of the P+ region 65 and or the N region 63. Without varying the doze levels, this step is also formed by applying a potential to the charge transfer portion 31 by an electrode which is partially formed over the P+ region 65

Figure 8:
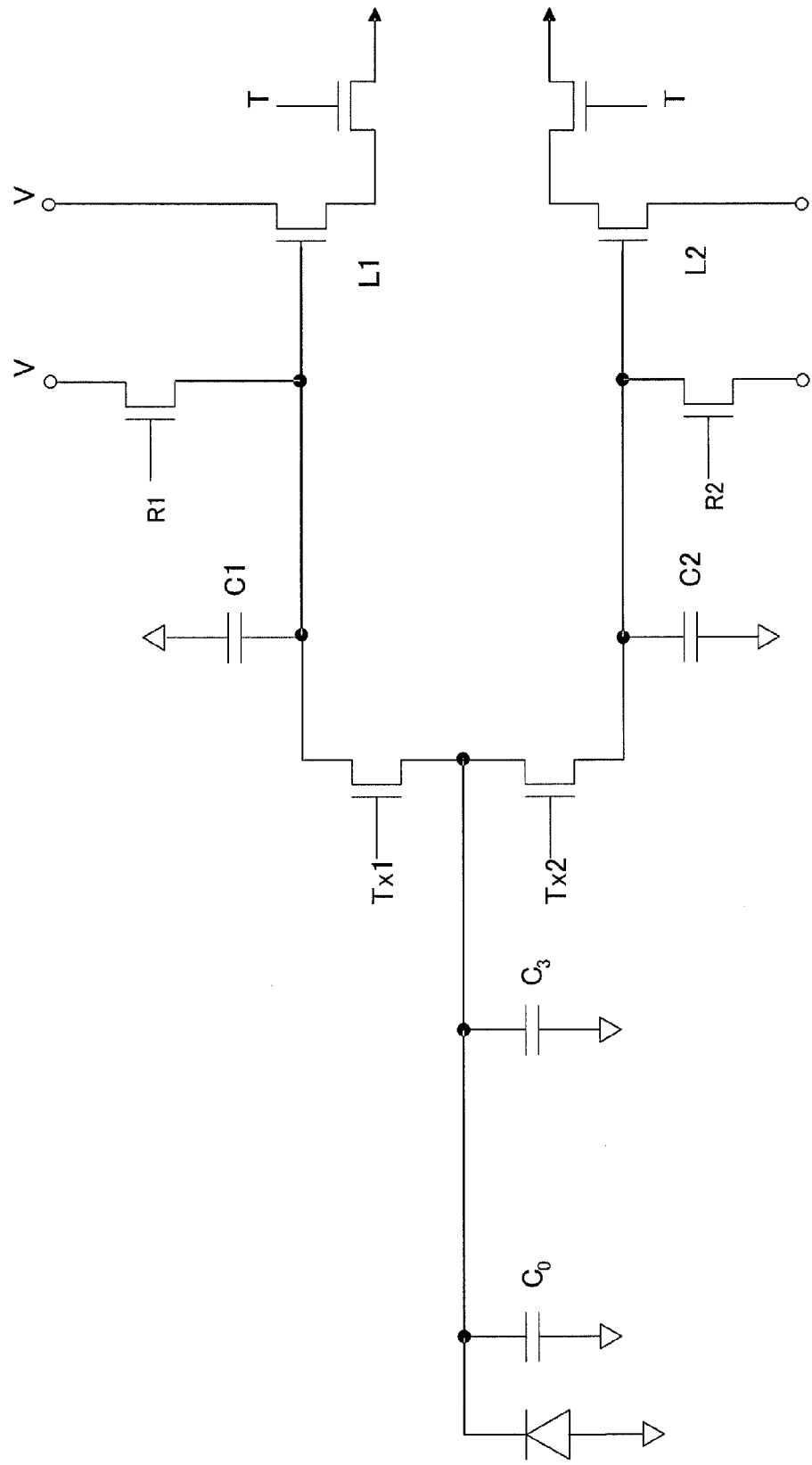
FIG. 8 is an equivalent circuit diagram of the pixel unit of FIG. 7.

FIG. 8 is a circuit diagram of the pixel unit 25 as shown in FIG. 7. The difference from the conventional structure as shown in FIG. 4 is in that a capacitor C3 is provided to the charge transfer portion 31.

Figure 9:
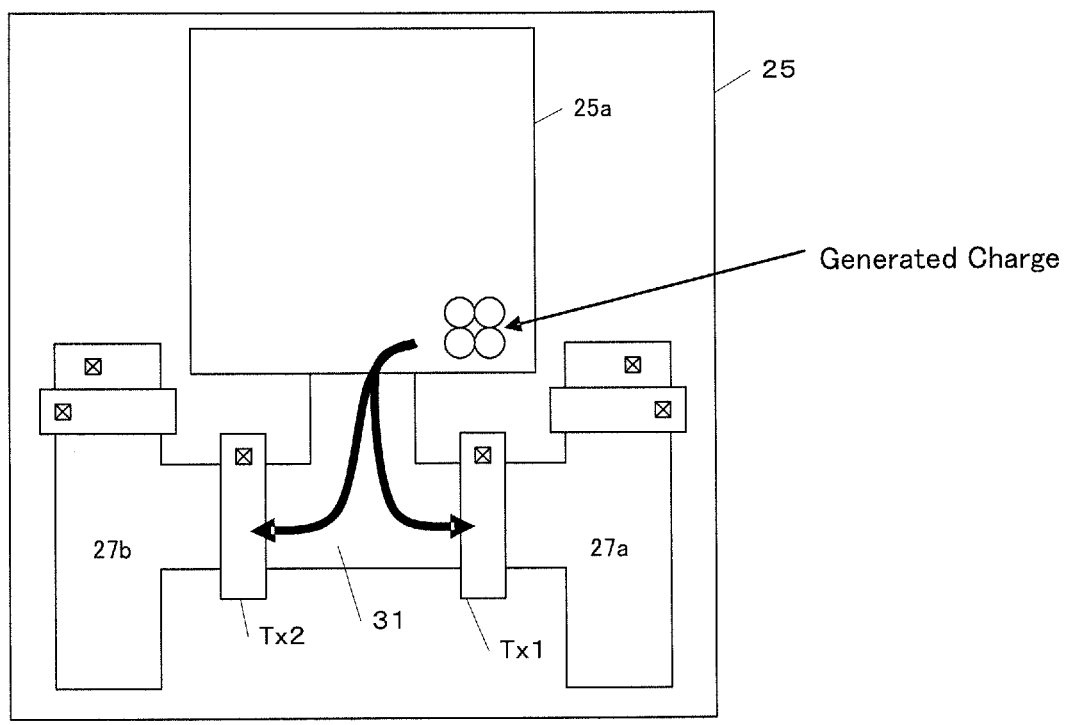
FIG. 9 schematically shows technical advantage according to the pixel unit of FIG. 7.

FIG. 9 is a figure for explaining the advantage of the embodiments according to this invention. According to this invention, charge generated in the photoelectric conversion portion 25a, whichever it is split to the first charge storage region 27a or the second charge storage region 27b, is at first commonly transferred to the charge transfer portion 31, after then is split to the first charge storage region 27a or the second charge storage region 27b. Therefore, if a light is projected an imbalance position of the photoelectric conversion portion 25a then the position of charge generation is in imbalance, the imbalance in charge splits is limited. Therefore, liability of the differential signal can be improved.

Figure 10:
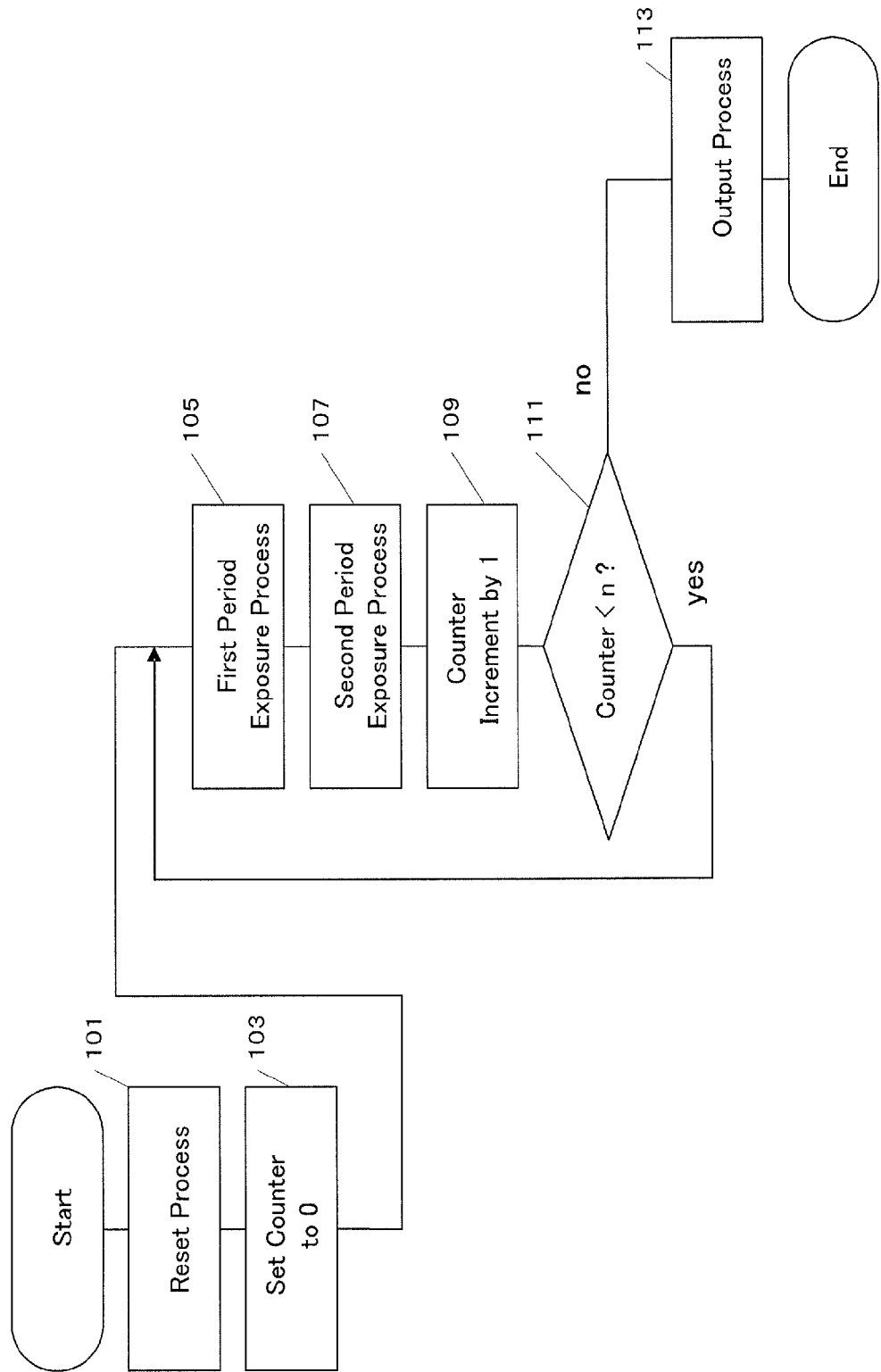
FIG. 10 is a flow chart of process of the embodiment of this invention.
Figure 11:
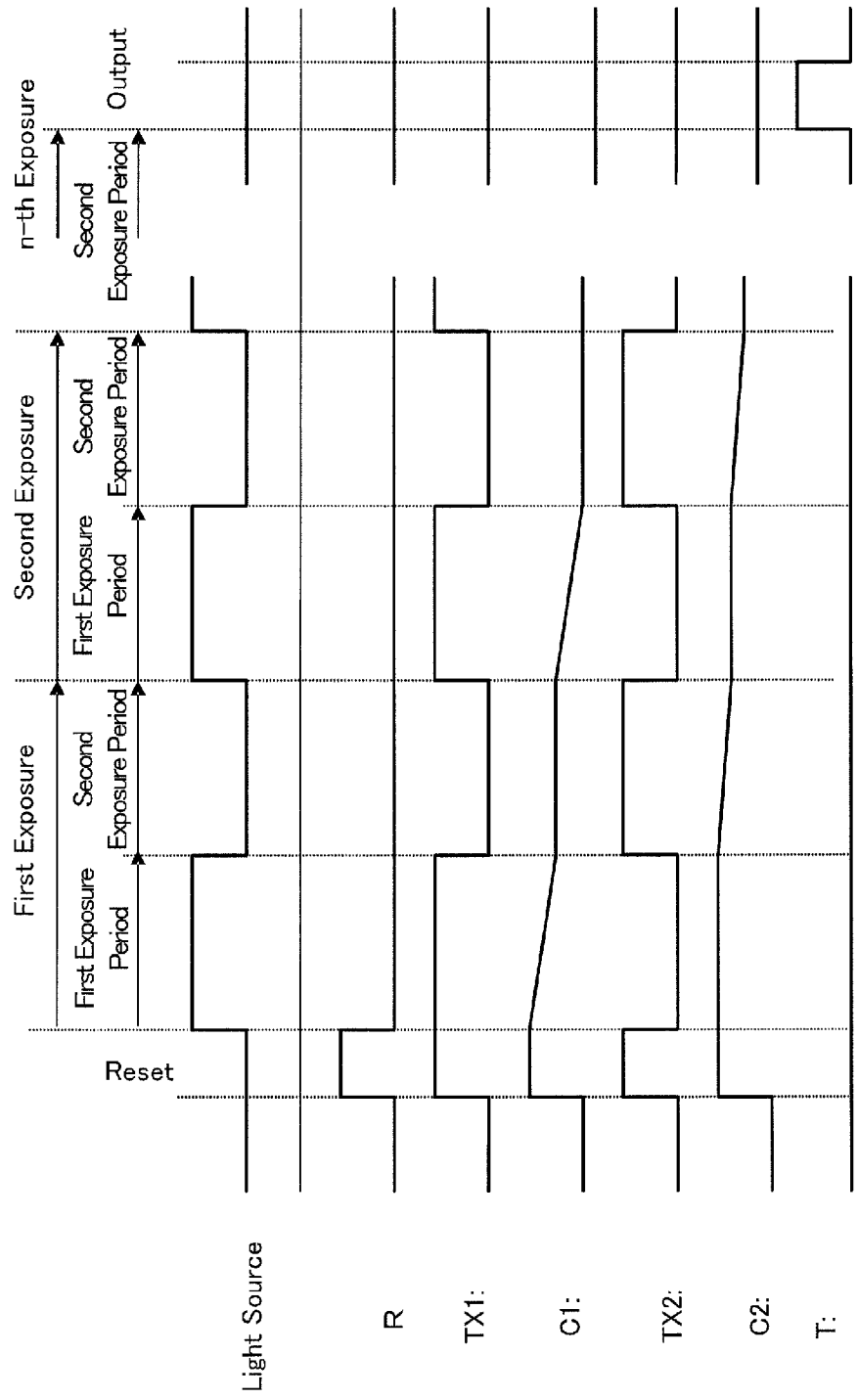
FIG. 11 is a timing chart of the embodiment of this invention.

Next, referring FIGS. 10 to 12, flow of process of the embodiment according to this invention is described. First, at the step 101, a reset process is performed. In the reset process, by applying voltage V to reset electrodes 29a, 29b via opening split gates Tx1, Tx2 and reset gates R1, R2, the charge storage regions 27a, 27b, that are, the capacitors C1, C2 are charged. The signal waveforms in FIG. 11 and the potential status in FIG. 12 (B) show this state. At the photoelectric conversion portion, accompanying the above mentioned reset process, charge as known as reset noise imposes into the capacitors. Under the condition that the reset noise is generated, the charge in the capacitors is read out, and, under the condition that the charges generated by exposure are accumulated, the charge in the capacitors is also read out, then, based on the difference between the charges read out, the charge generated by the exposure is measured. Thus, a read out process with cancelling the reset noise can be achieved. This process is called as double sampling. Embodiments of this invention described later employ the double sampling.

At step 103, the counter of the exposure cycle is set to zero. Referring FIG. 11, the exposure cycle is synchronized with emission cycle. One exposure cycle includes a first exposure period (corresponding to step 105) corresponding to emission cycle of the light source and a second exposure period corresponding to the period during which the light source does not emit. The number n of exposure cycle can vary from tens to a thousand according to the imaging environment. The counter number is incremented one by one exposure cycle (the step 109), if the counter number reaches n (the step 111), an output process starts (the step 113).

Referring FIG. 11, the charge generated in the photoelectric conversion portion during the first exposure period is accumulated at the first storage region 27a that is the capacitor C1, via the gate Tx1. Since the capacitor C1 is charged with positive charge by the reset process, the charge in the capacitor C1 is reduced by the charge generated during the first exposure period The charge generated during the second exposure period is via the gate Tx2 stored at the second charge storage portion 27b, that is, the capacitor C2. After n times of the exposure cycles, the charge accumulated in the capacitor C1 and the charge accumulated in the capacitor C2 are via the gate T measured by the differential circuit 15.

FIG. 12(C) shows a state that at the beginning of the first exposure cycle the split gate Tx1 is opened. FIG. 12(D) shows a way that the charge generated in the photoelectric conversion portion 25a moves into the first charge storage region 27a via the transfer gate 31. FIG. 12(E) shows a state that at the begging of the second exposure cycle the split gate Tx2 is opened. FIG. 12(F) shows a way that the charge generated by the photoelectric conversion portion 25 moves from the charge transfer portion 31 to the second charge storage region 27b.

FIG. 12(G) shows a state that at the beginning of the first exposure period of the second exposure cycle the split gate Tx1 is opened. FIG. 12(H) shows a way that the charge generated by the photoelectric portion 25a moves to the first charge storage region 27a. Thus, until the end of nth exposure cycle, the charge generated during each exposure cycle is accumulated in the first, second charge storage regions 27a, 27b.

Drain Gate

Figure 13:
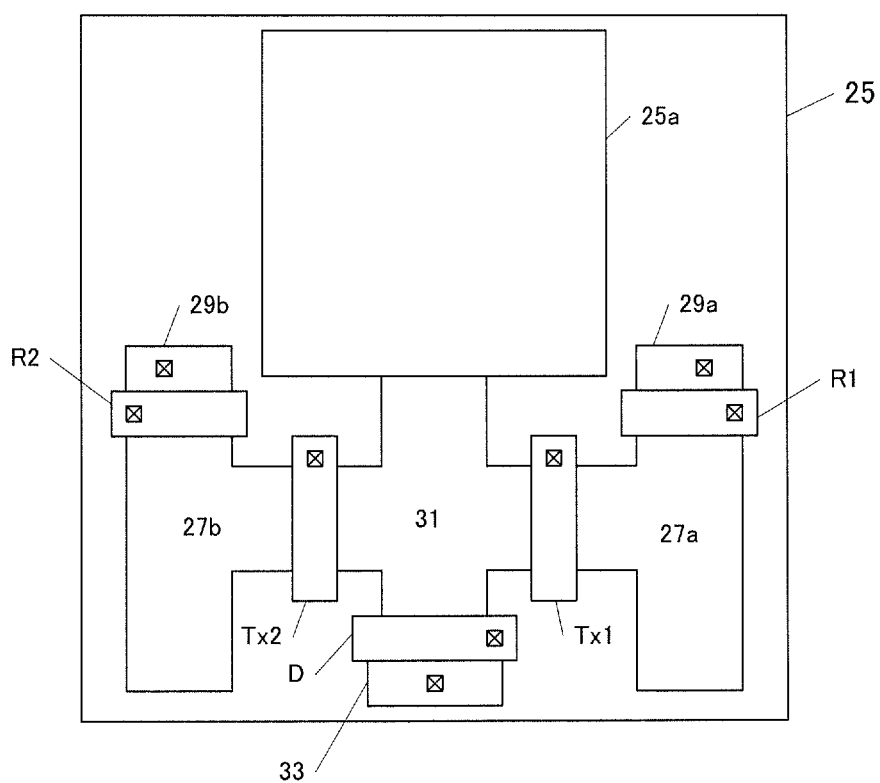
FIG. 13 shows a structure of a pixel unit of another embodiment of this invention.
Figure 14:
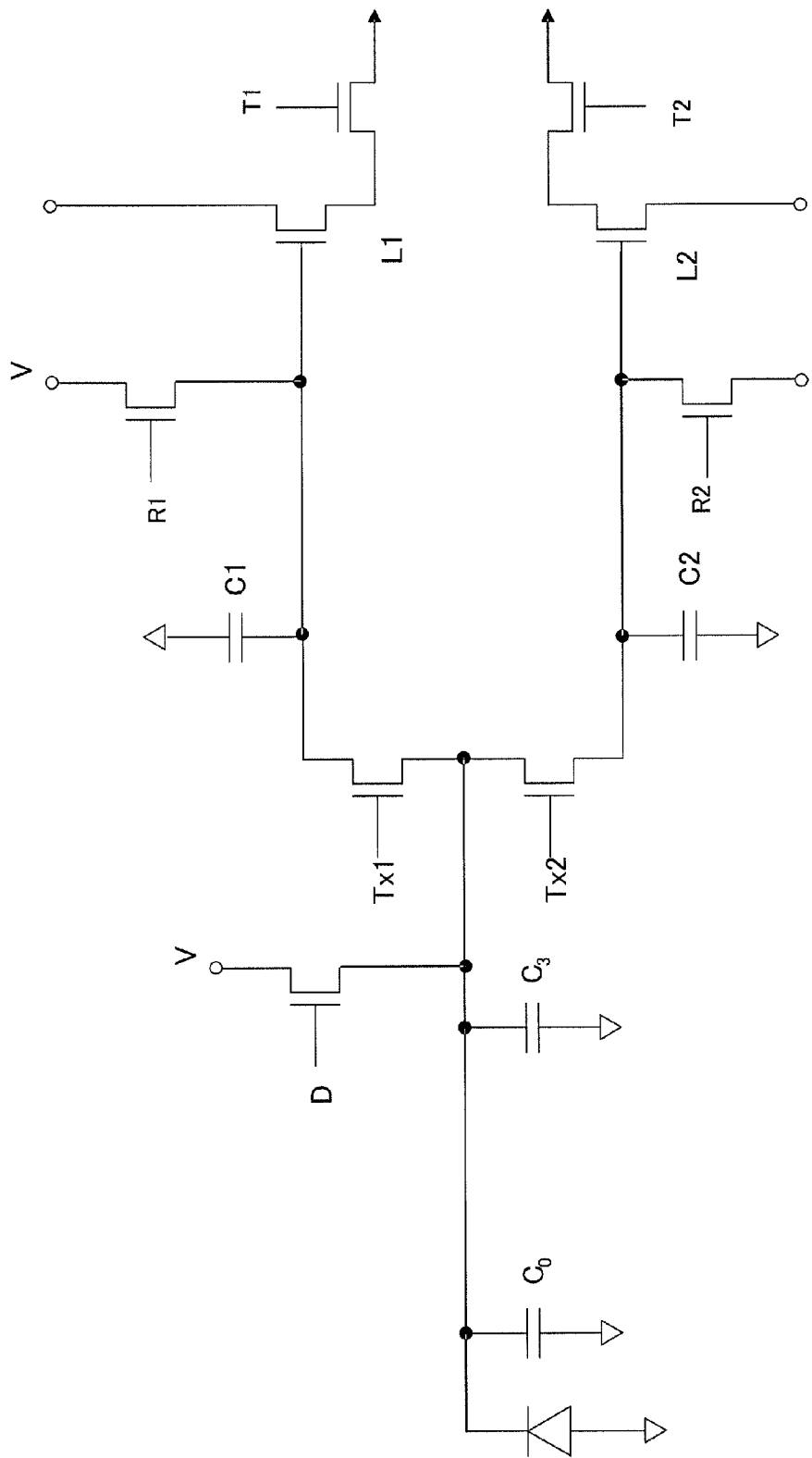
FIG. 14 is an equivalent circuit diagram of the pixel unit of FIG. 13.
Figure 15:
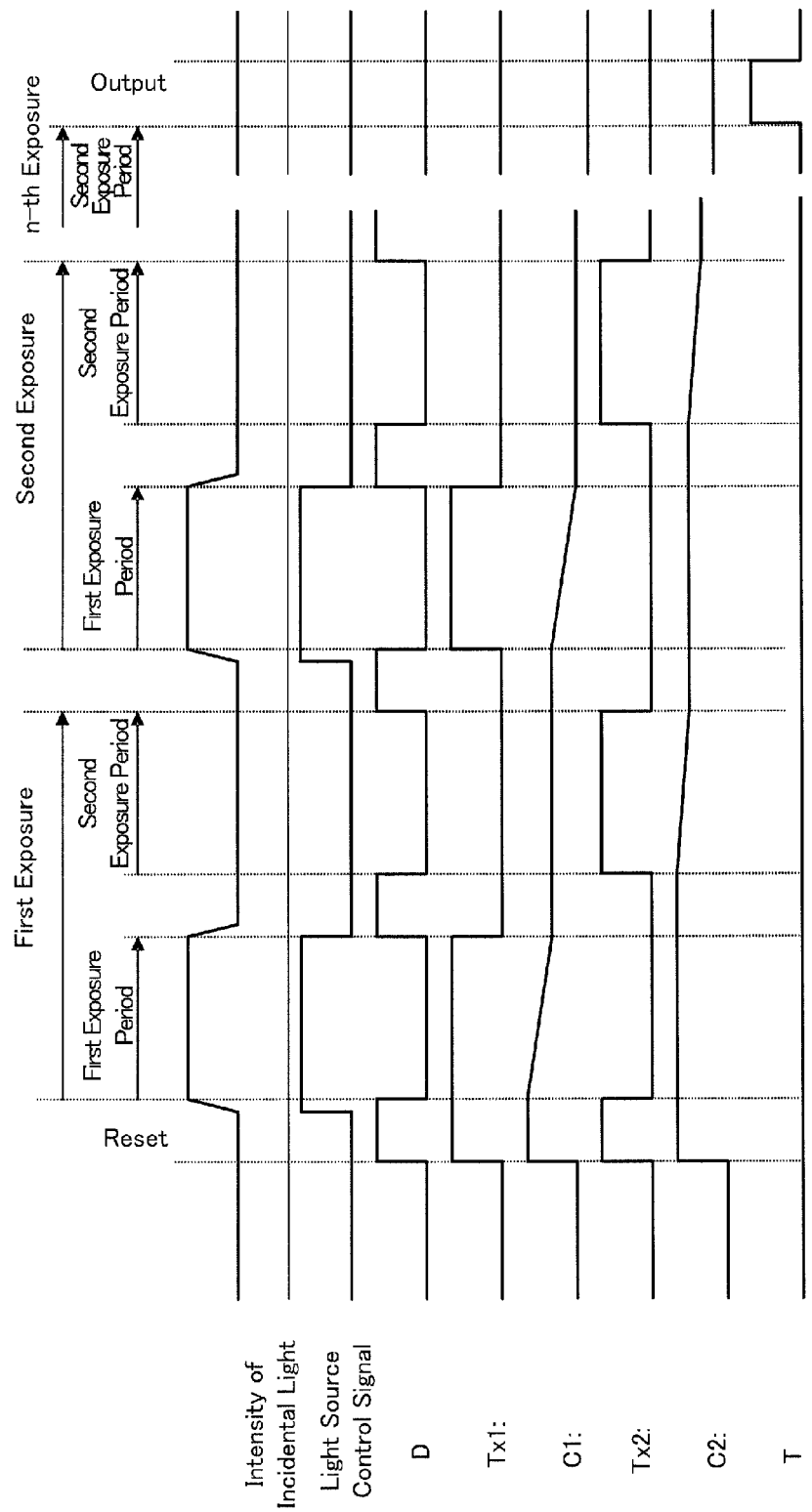
FIG. 15 is a timing chart of the pixel unit of FIG. 13.

Referring FIGS. 13 to 15, an embodiment of the invention provided with a drain gate D and a drain electrode 33 is described. FIG. 13 is a layout diagram showing a pixel unit corresponding to the one in FIG. 7, and the same elements have the same reference numbers. The differentiation between the features in FIG. 13 and FIG. 7 is in that the charge transfer portion 31 in FIG. 13 is connected to a drain electrode 33 via a drain gate D. FIG. 14 is a circuit diagram corresponding to the structure in FIG. 13.

FIG. 15 shows a process of the pixel unit 25 of FIG. 13 during the exposure cycle. FIG. 15 does not show the reset signal in FIG. 11, but as same as the situation in FIG. 11, a reset process is conducted for the pixel unit 25 in FIG. 13. A reset signal is applied to the reset gates R1, R2, at the same time the split gates Tx1, Tx2 are opened.

If the turning on or the turning off of the light source takes a time, the rising edge portion, or the falling edge portion of the charge, the drain gates and the drain electrodes work to drain the rising edge portion, or the falling edge portion of the charge generated in the photoelectric conversion portion, so as to generate a stable condition of the charge. Referring to FIG. 15, the drain gate D is opened in synchronized with the timing of the emission of the light source at the rising edge of the light emission so as to drain the charge into the drain electrode 33. According to FIG. 15 that is timing chart of the charge storage region 15, the drain gate D is also opened to drain charge at the falling edge of the light emission.

Transfer Gate

Next, referring to FIGS. 16-19, another embodiment wherein the charge transfer portion 31 is connected to a photoelectric conversion portion 25a via a transfer gate Tx0 is described. The structure of the pixel unit shown in FIG. 16 has a difference from the pixel unit in FIG. 7 in that the transfer gate Tx0 is provided between the photoelectric conversion portion 25a and the charge transfer portion 31. Elements in FIG. 16 corresponding to the elements in FIG. 7 have the same reference numbers.

Figure 16:
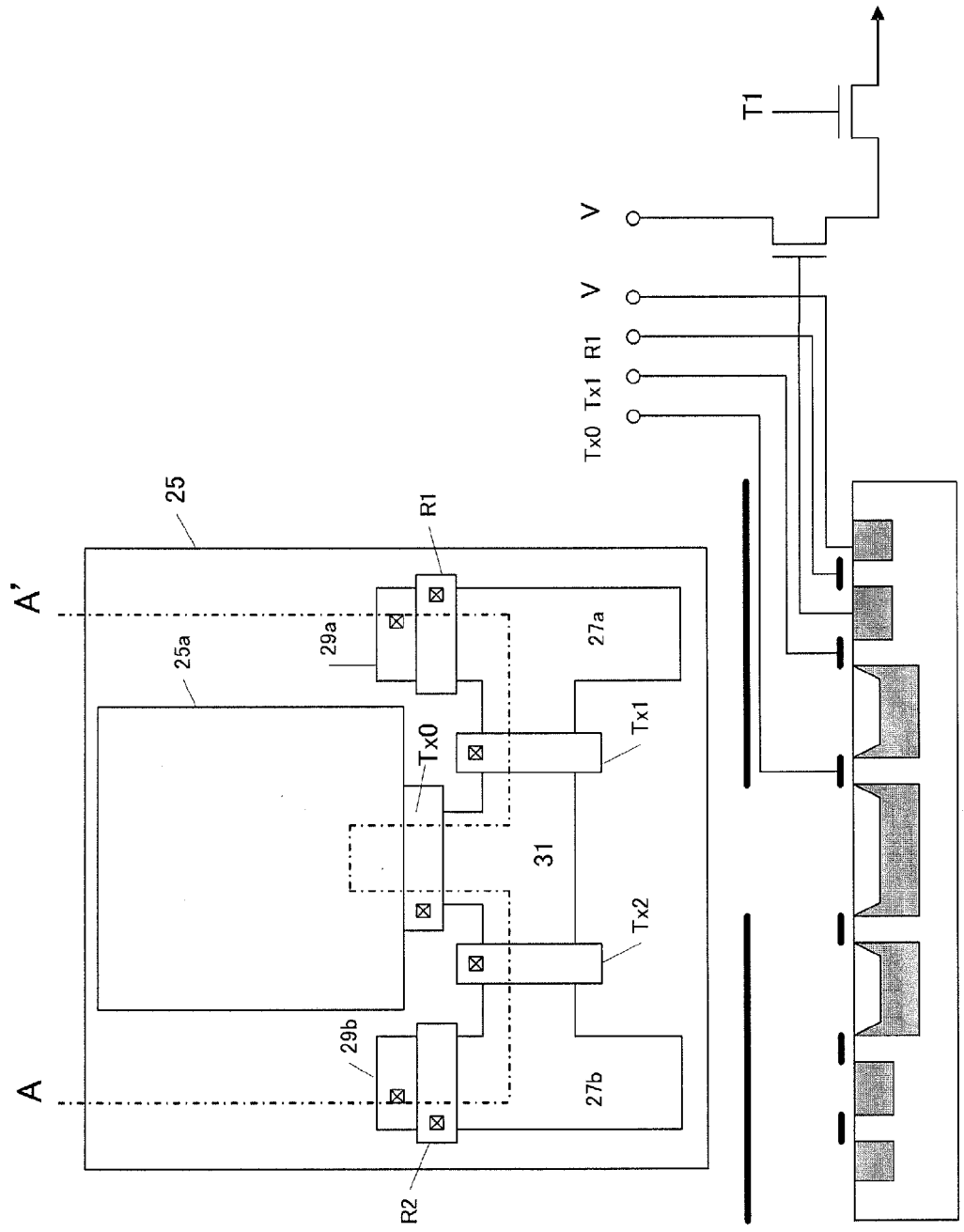
FIG. 16 shows a structure of a pixel unit of a further alternative embodiment of this invention.
Figure 17:
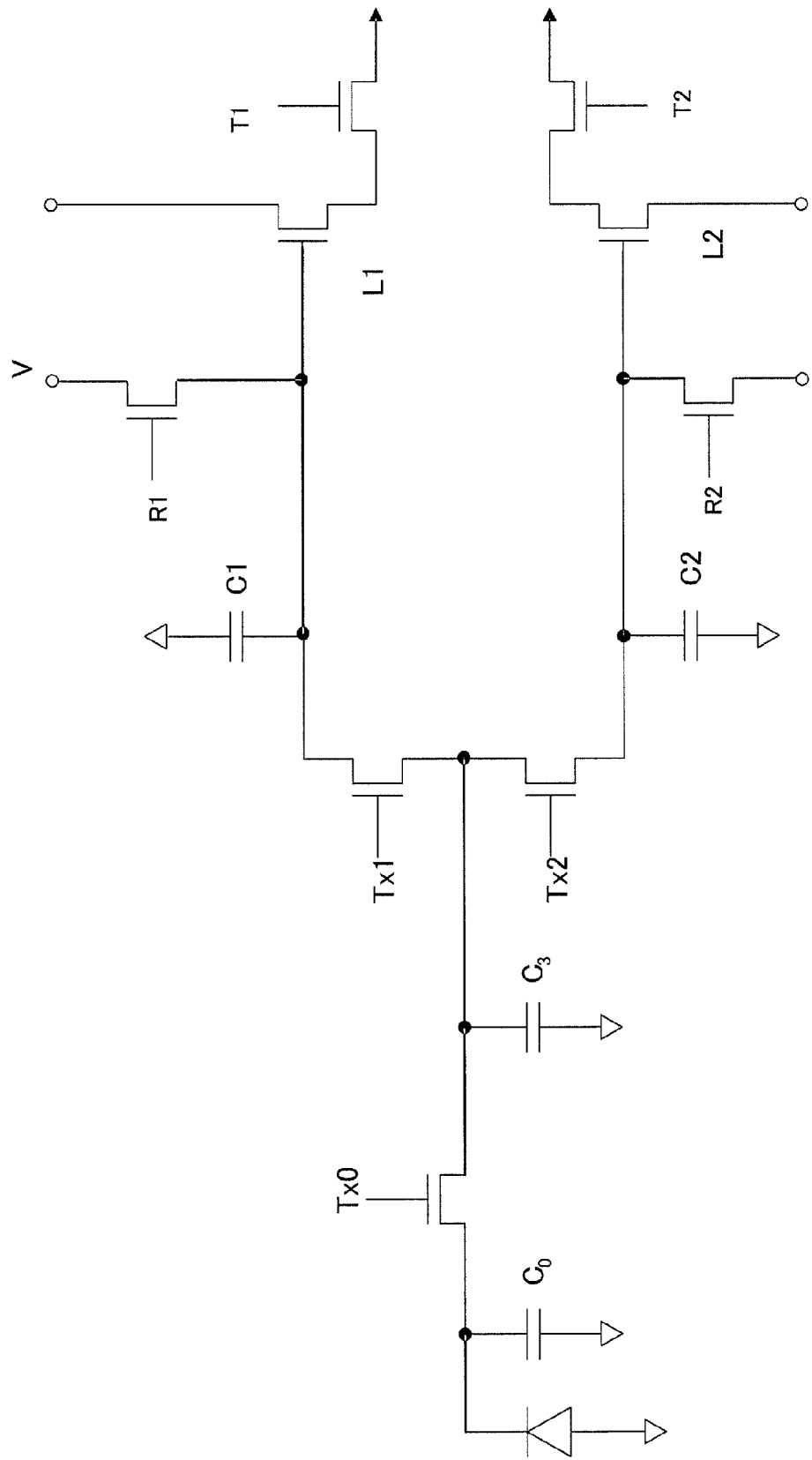
FIG. 17 is an equivalent circuit diagram of the pixel unit of FIG. 16.
Figure 18:
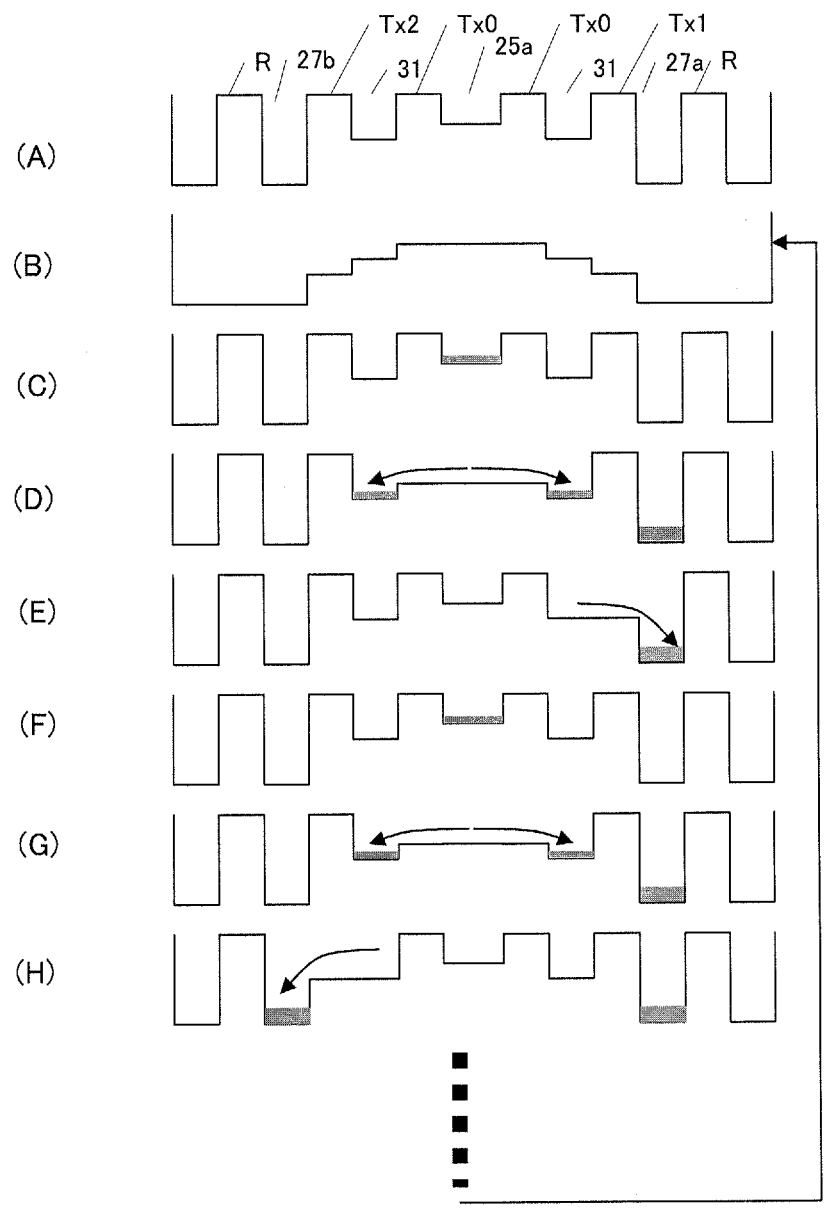
FIG. 18 shows potential transition of the pixel unit of FIG. 16.

FIG. 17 is a circuit diagram of the pixel unit in FIG. 16. The transfer gate Tx0 is provided between an equivalent capacitor C0 to the photoelectric conversion portion and an equivalent capacitor C3 to the charge transfer portion 31. FIG. 18 is a potential transition diagram corresponding to FIG. 12. Each potential state of FIG. 18 (A) to (H) corresponds to each state of FIG. 12(A) to (H), respectively.

FIG. 18(A) shows a potential when no operation is applied. FIG. 18(B) shows a potential when previously mentioned reset operation is applied by opening all the gates. FIG. 18(C) shows a state that charge is generated in the photoelectric portion 25a. FIG. 18(D) shows a state that the charge moves to the charge transfer portion 31 by opening the transfer gate Tx0. FIG. 18(E) shows a state that the charge is transferred to the first charge transfer portion 27a by opening the split gate Tx1. FIG. 18(F) shows a state that charge is generated in the photoelectric conversion portion 25a during the second exposure period. FIG. 18(G) shows a state that charge is transferred to the charge transfer portion 31 by opening the transfer gate Tx0. FIG. 18(H) shows a state that the charge is transferred to the second charge storage region 27a by opening the split gate Tx2.

Transfer gate Tx0 works for equalizing the split charge. The transfer gate Tx0 is opened at longer time than the split gate. The transfer time of the charge to the charge transfer portion is settled by the transfer gate Tx0. The fluctuation in the split timing hardly influences the resulted outcome.

Figure 19:
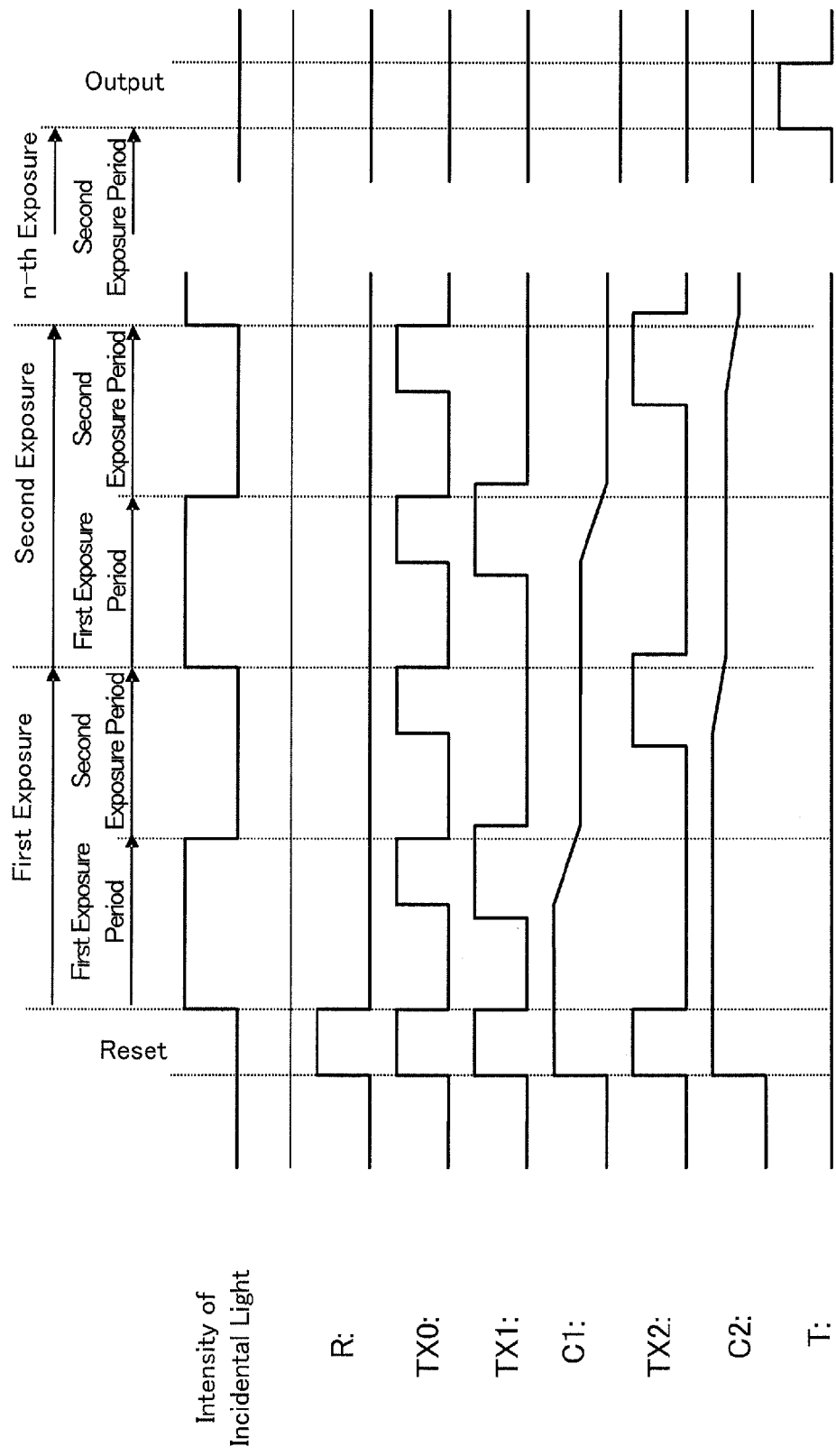
FIG. 19 is a timing chart of the pixel unit of FIG. 16.

FIG. 19 is a timing chart of the pixel unit 25 of FIG. 16. FIG. 19 is different from FIG. 16 in that the transfer gate Tx0 is provided. The transfer gate Tx0 is opened nearly at the end of the exposure period so as to work to transfer the charge to the charge transfer portion 31.

Drain Gate and Transfer Gate

Figure 20:
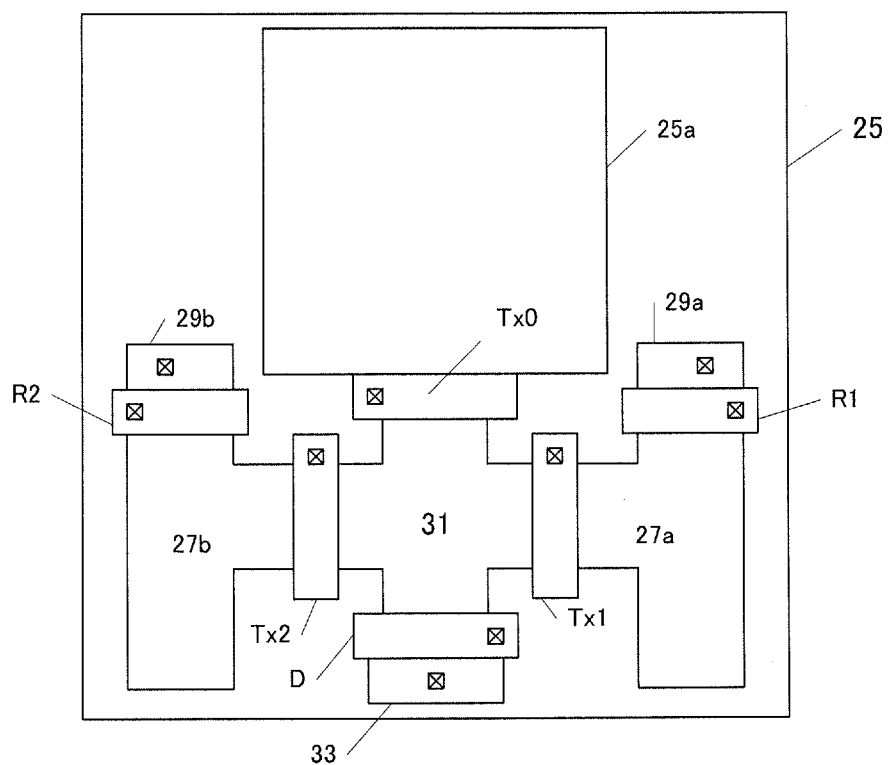
FIG. 20 shows a structure of a pixel unit of a further alternative embodiment of this invention.
Figure 21:
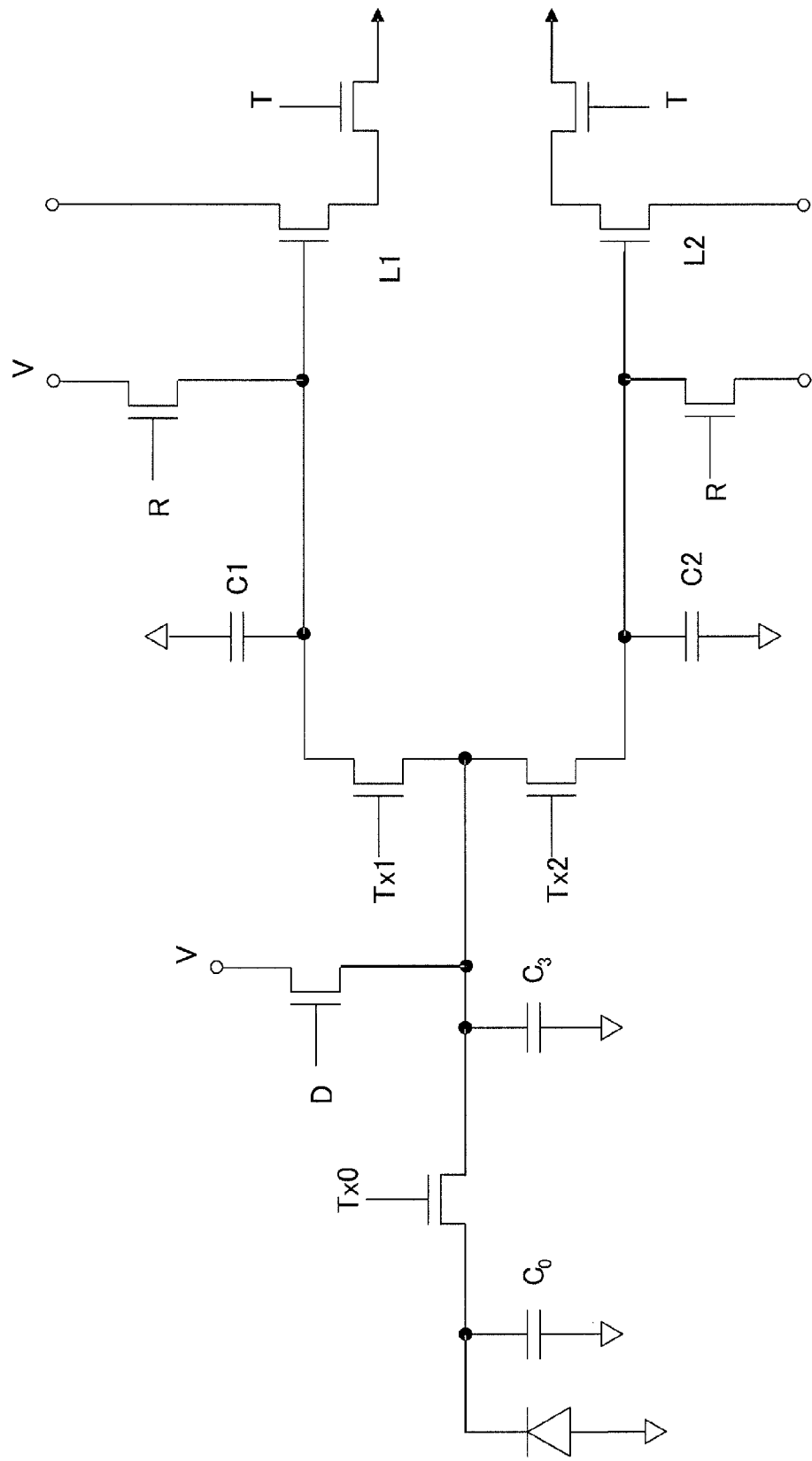
FIG. 21 is an equivalent circuit diagram of the pixel unit of FIG. 20.
Figure 22:
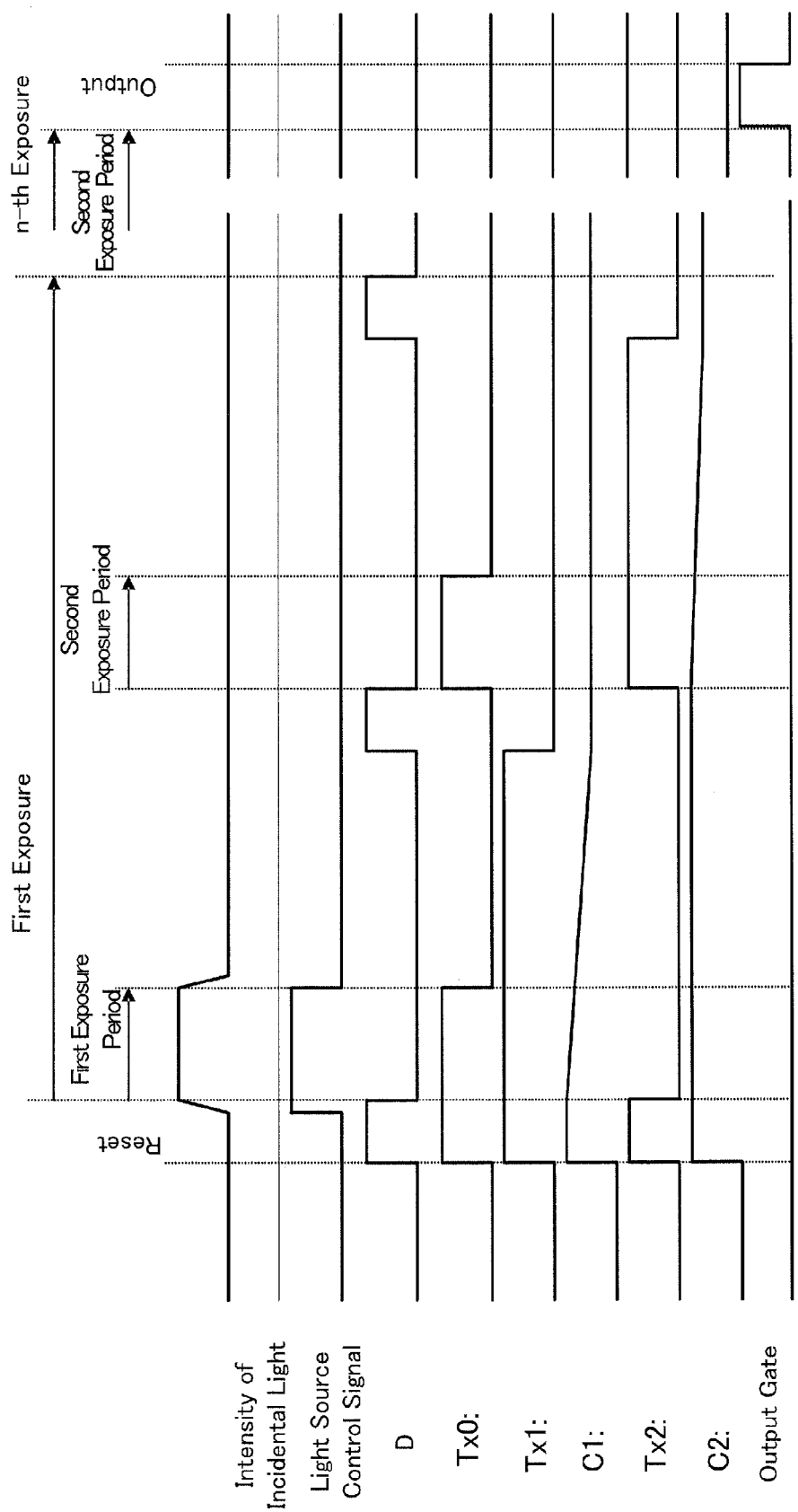
FIG. 22 is a timing chart of the pixel unit of FIG. 20.

Referring FIGS. 20 to 22, another embodiment provided with a drain gate and a transfer gate is described. FIG. 20 is a diagram of a pixel unit of this embodiment corresponding to FIG. 13. The difference from the embodiment in FIG. 13 is in that the transfer gate Tx0 is provided between the photoelectric conversion portion 25a and the charge transfer portion 31. FIG. 21 is an equivalent circuit diagram of this embodiment.

FIG. 22 is a timing chart of this embodiment. This embodiment employs a long time duration between the first exposure period and the second exposure period in one exposure cycle. At the rising time of the exposure, the charge at the charge transfer portion 31 is drained by opening the drain gate D. By opening the transfer gate Tx0 at the same time of closing the drain gate D, the charge generated in the photoelectric conversion portion 25a is transferred to the charge transfer portion 31. During the first exposure period, at the same time of opening the transfer gate Tx0 the split gate Tx1 is opened the charge is transferred to the charge storage region 27a. The split gate Tx1 is still opening after the transfer gate Tx0 is closed. The split gate Tx1 may be opened just before the beginning of the process for preparing the second exposure time period. Thus, the charge in the charge transfer portion 31 can be completely transferred to the charge storage region 27a. This embodiment demonstrates its technical advantage especially for the structure that the charge transfer time from the photoelectric conversion portion 25a to the charge transfer portion 31 is short Next, several alternatives will be explained.

Configuration of Photoelectric Conversion Portion 25a

Figure 23:
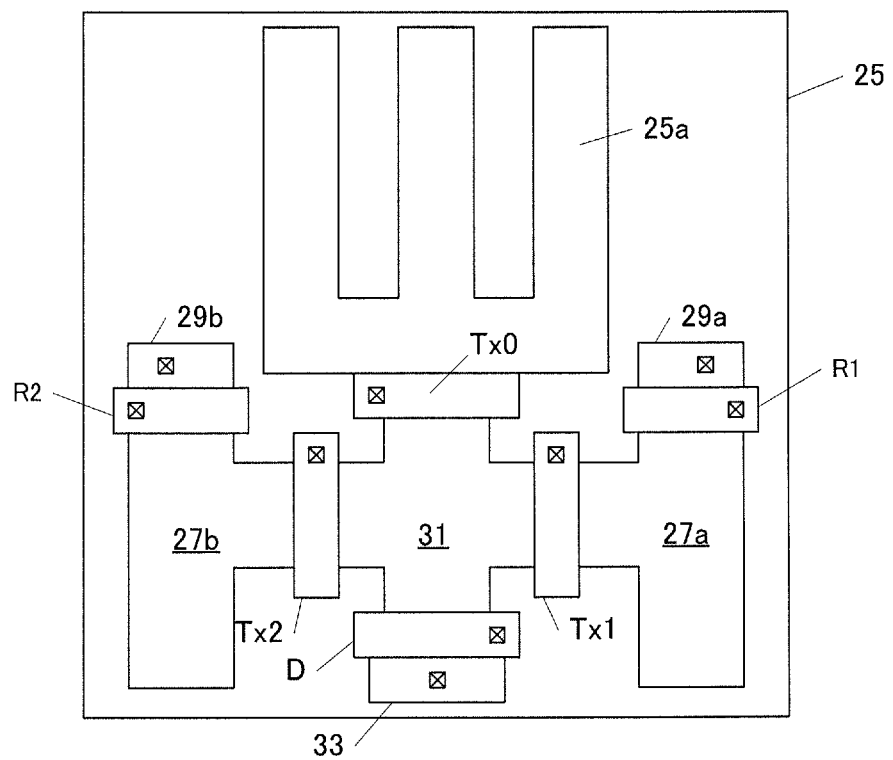
FIG. 23 shows a structure of a pixel unit of a further alternative embodiment of this invention.

FIG. 23 shows an alternative embodiment wherein the shape of the photoelectric conversion portion 25a as shown in FIG. 20 is shaped like a comb. According to this comb shape, a minimum width of each of the portions of the photoelectric conversion portion 25a is narrower than a minimum width of the charge transfer portion 31. Then, without changing ion concentration (doping level), a potential can be high, and a ratio of charge transfer by drift can be enhanced.

Division of Photoelectric Conversion Portion 25a

Figure 24:
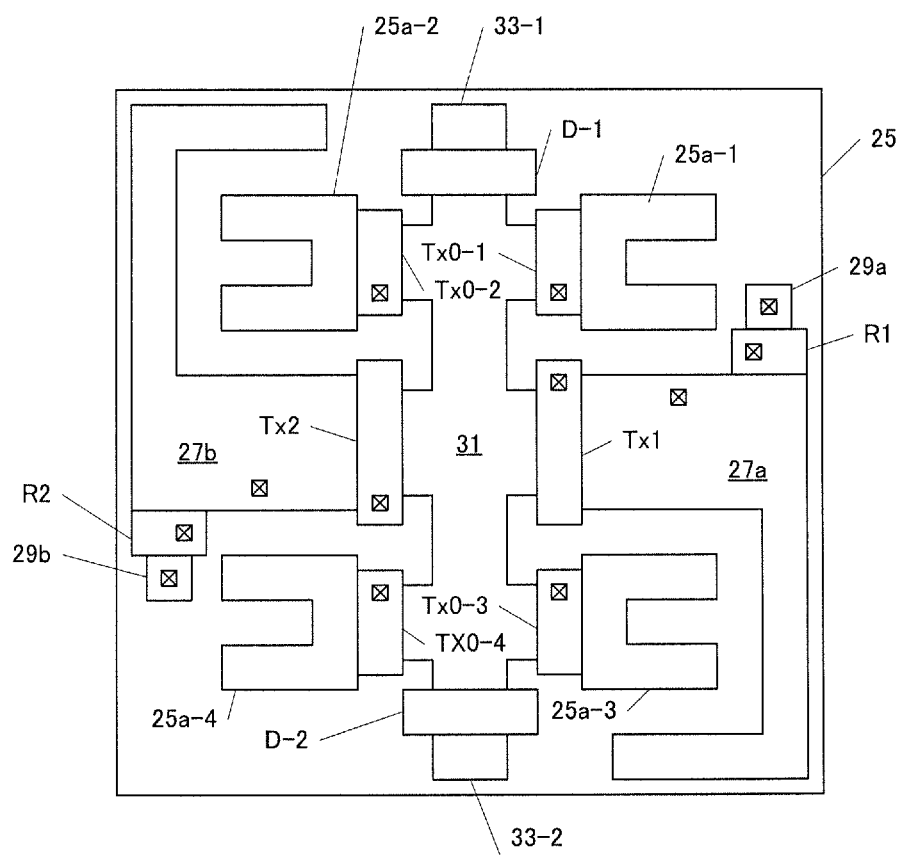
FIG. 24 shows a structure of a pixel unit of a further alternative embodiment of this invention.

FIG. 24 shows an alternative embodiment of the pixel unit 25 as shown in FIG. 20, and the photoelectric conversion portion 25a includes four fine photoelectric conversion portions 25a-1, 25a-2, 25a-3, and 25a-4. These four fine photoelectric conversion portions are commonly connected to the charge transfer portion 31, via transfer gates Tx0-1, Tx0-2, Tx0-3, and T0x-4, respectively. Since each of the four photoelectric conversions is fine, gradients of potential are formed. The transmission of the charge to the transfer portion 31 by drift can enhanced. By dividing the photoelectric portion 25a into plural portions, the transmittal time of the charger can be shorted.

MOS Capacitor

Figure 25:
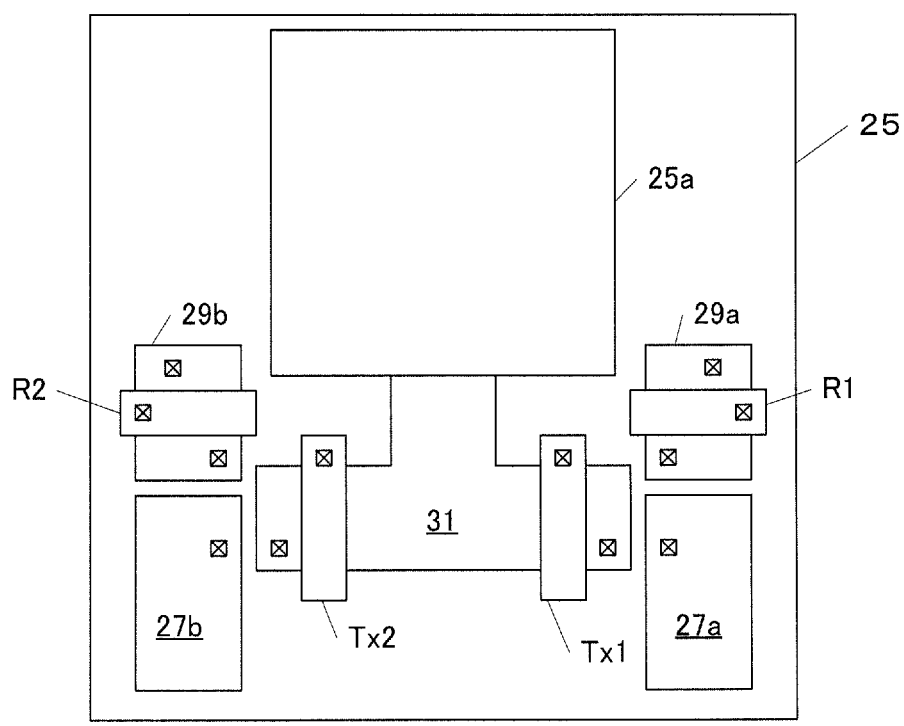
FIG. 25 shows a structure of a pixel unit of a further alternative embodiment of this invention.

In the above mentioned embodiments, the charge storage regions 27a, 27b may be configured as a MOS (Metal-Oxide-Silicon) structure. The MOS capacitor structure per se is well known. FIG. 25 shows an example wherein each of the charge storage regions 27a and 27b in the pixel unit 25 in FIG. 7 is divided and main portions of the charge storage portions are configured by MOS capacitor. Likewise, in other embodiments, the charge storage portions may be configured by MOS capacitors, also.

Micro Lens

Figure 26:
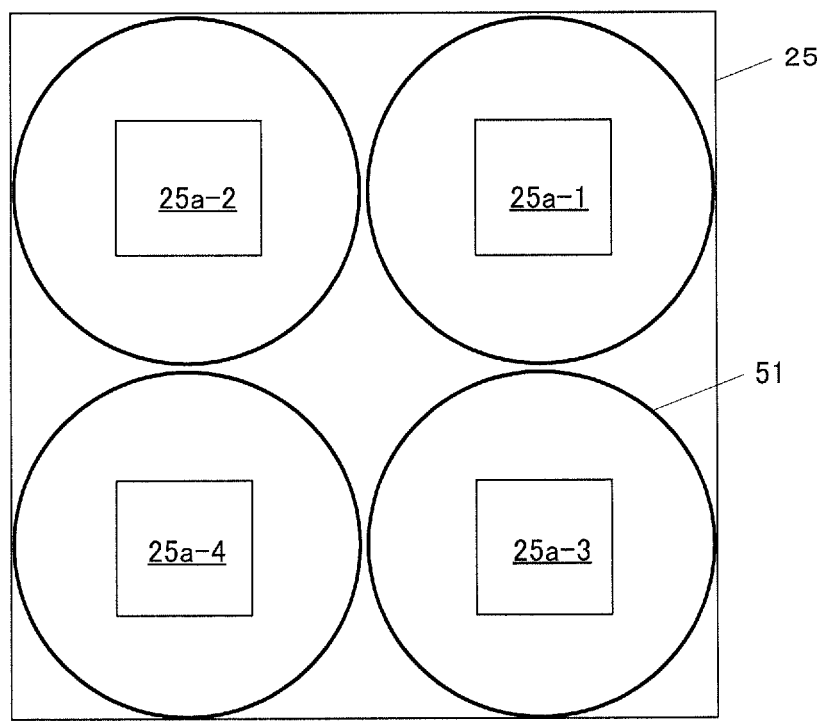
FIG. 26 shows an embodiment of this invention provided with a micro lens.

In the embodiments of this invention, a micro lens may be provided in front of the incidental direction of the photoelectric conversion portion 25a, thereby a condense ratio can be enhanced. FIG. 26 shows an embodiment wherein the photoelectric conversion portion 25a is comprised of four fine photoelectric conversion portions 25a-1, 25a-2, 25a-3, and 25a-4 and in front of each of these fine photoelectric conversions micro lens is provided. By preparing the same number of the lens to adjust the positioning of them for the photoelectric conversion portions 25a-1, 25a-2, 25a-3, and 25a-4, the waste of the light can be eliminated, and, the light sensitivity can be improved.

Read Out Storage Portion

Figure 27:
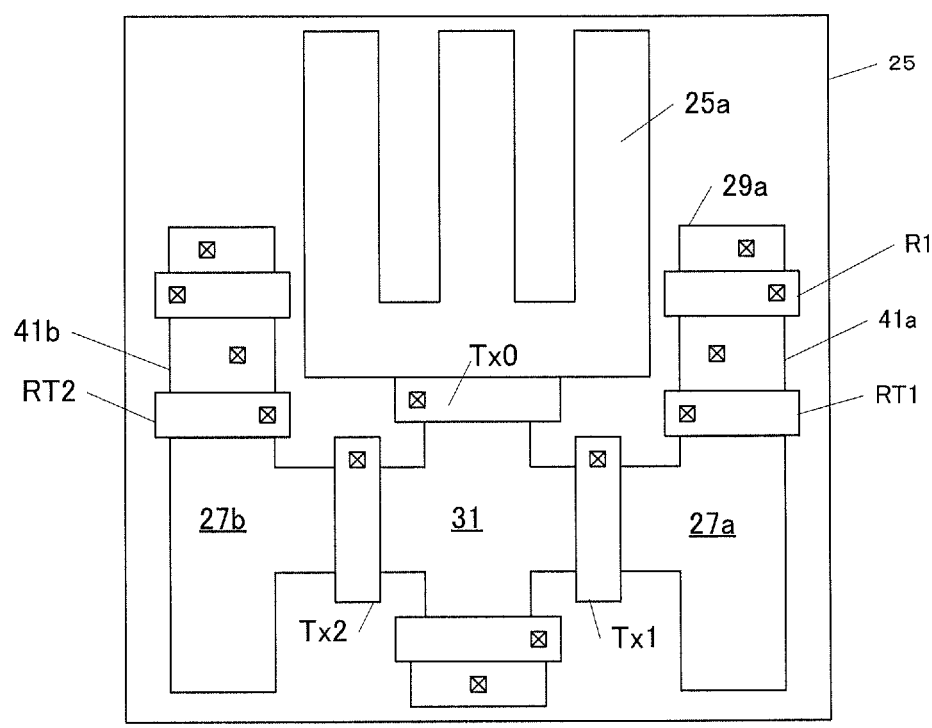
FIG. 27 shows a structure of a pixel unit of a further alternative embodiment of this invention.
Figure 28:
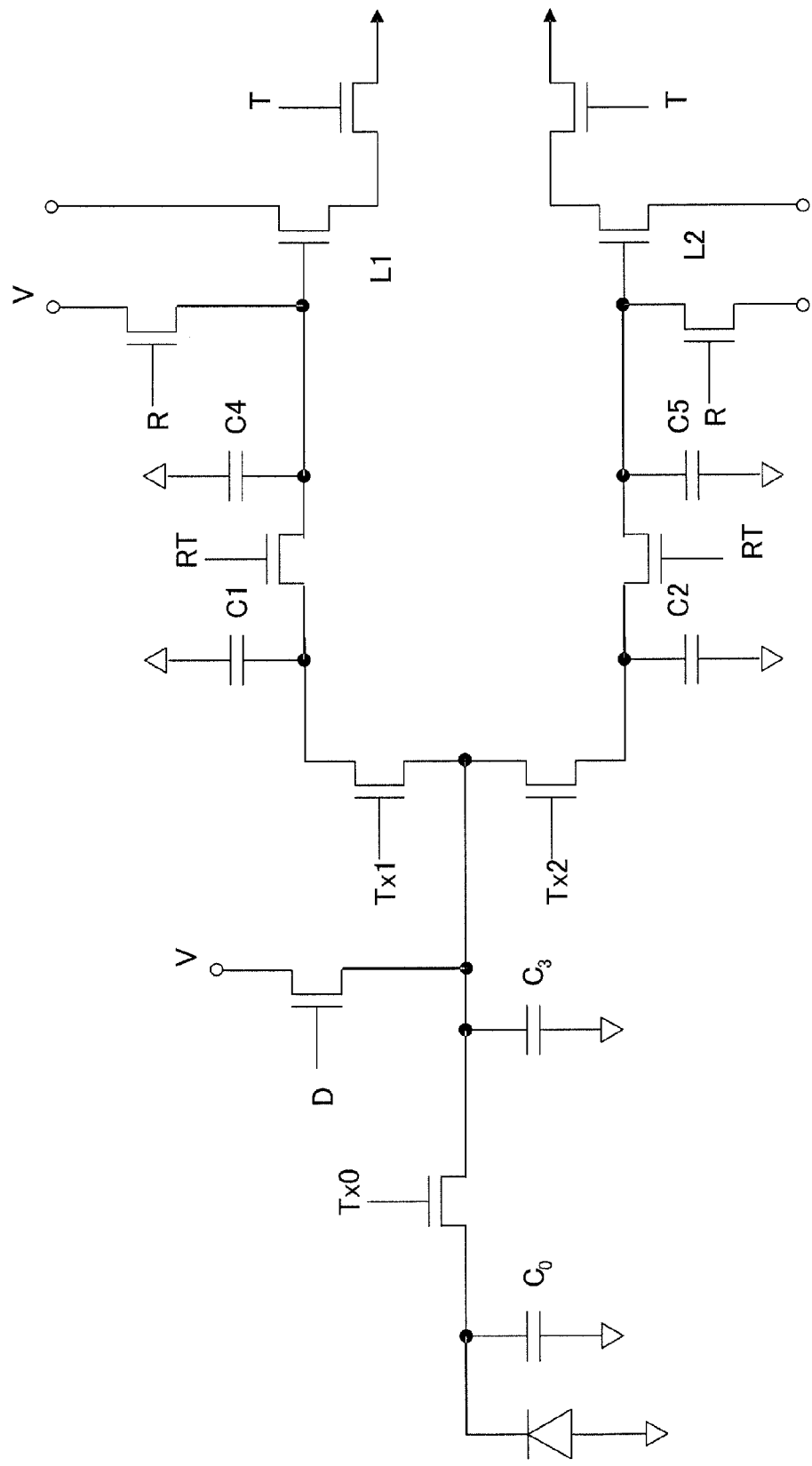
FIG. 28 is a timing chart of the pixel unit of the embodiment of FIG. 27.
Figure 29:
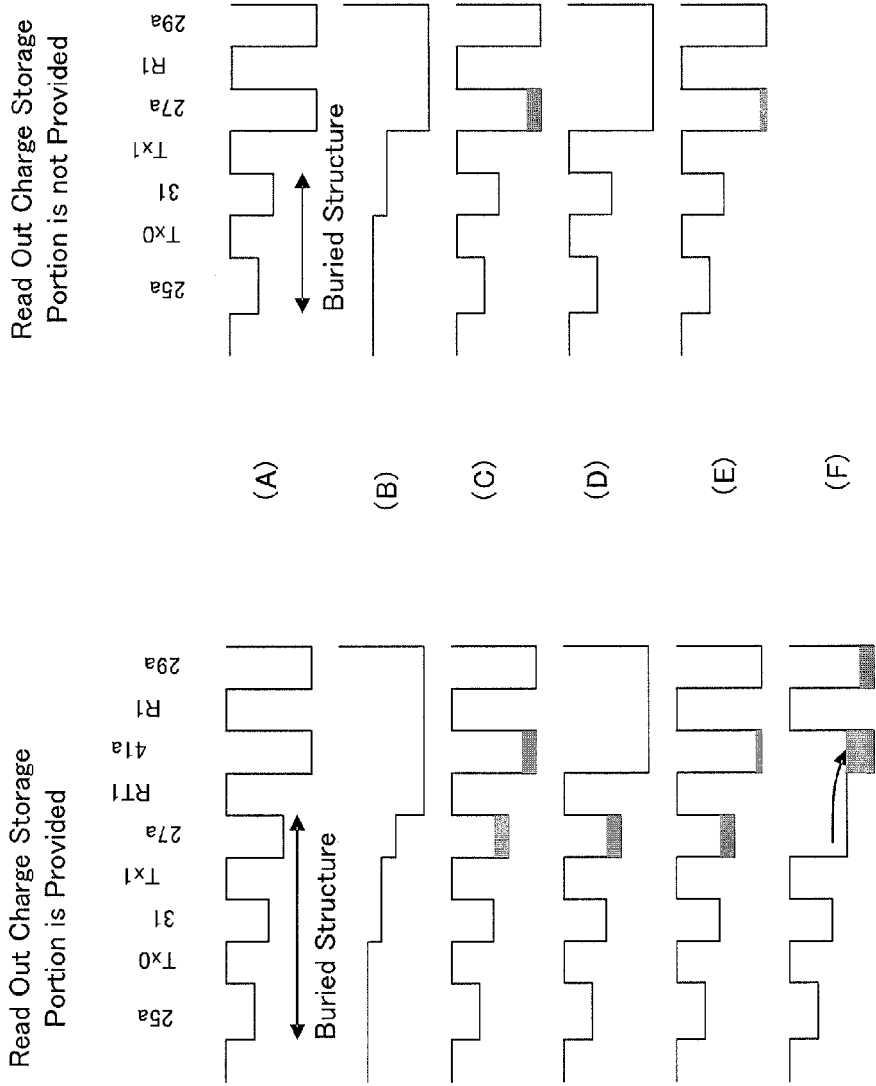
FIG. 29 shows potential of the pixel unit of the embodiment of FIG. 27.

FIG. 27 shows an embodiment wherein read out charge storage regions 41a, 41b are provided adjacent to the gates 27a, 27b, via the gates RT1, RT2. FIG. 28 is an equivalent circuit diagram showing that a capacitor C4 corresponding to the read out charge storage region 41a via the gate RT, and a capacitor C5 corresponding to the read out charge storage region 41b FIG. 29 shows a state transition of potential in the pixel unit in FIG. 27 which are provided with the read out charge storage regions 41a, 41b (left side of FIG. 29), in construction to a state transition of potential in the pixel unit in FIG. 23 which are not provided with such charge storage regions (right side of FIG. 29). FIG. 29(A) shows a potential state where any operation is not yet applied to the circuits. FIG. 29(B) shows potential state at a reset operation prior to the above mentioned exposure cycle. FIG. 29(C) shows, the potential state that charge is accumulated in the charge storage region 27a, after n times of exposure and charge transfer. In the left side potential transition figure, it is shown that the remaining charge and noise of the previous exposure cycle is still remained in the read out charge storage region 41a. In the potential transition figure at the right side of FIG. 29, it is shown that, since read out charge storage region is no provided, the charge stored at the charge storage region 27a is read out.

The left side of FIG. 29(D) shows a state that charge is reset by opening the reset gate R1. As shown in FIG. 29(E), noise is remained in the charge storage region 41a. Following a state as shown in FIG. 29(E), in a state as shown in FIG. 29(F) the charge stored in the charge storage region 27a is, by opening the read out transfer gate, read out and transferred to the charge storage region 41a. By reading out the potential of this read out charge storage region 41a, and the differential from the potential stored in the state as shown in FIG. 29(E) is measured. Thus, without interference by noise, potential based on the charge stored by exposure can be read out. Thus, the above mentioned double sampling technique can be implemented by this invention.

Figure 30:
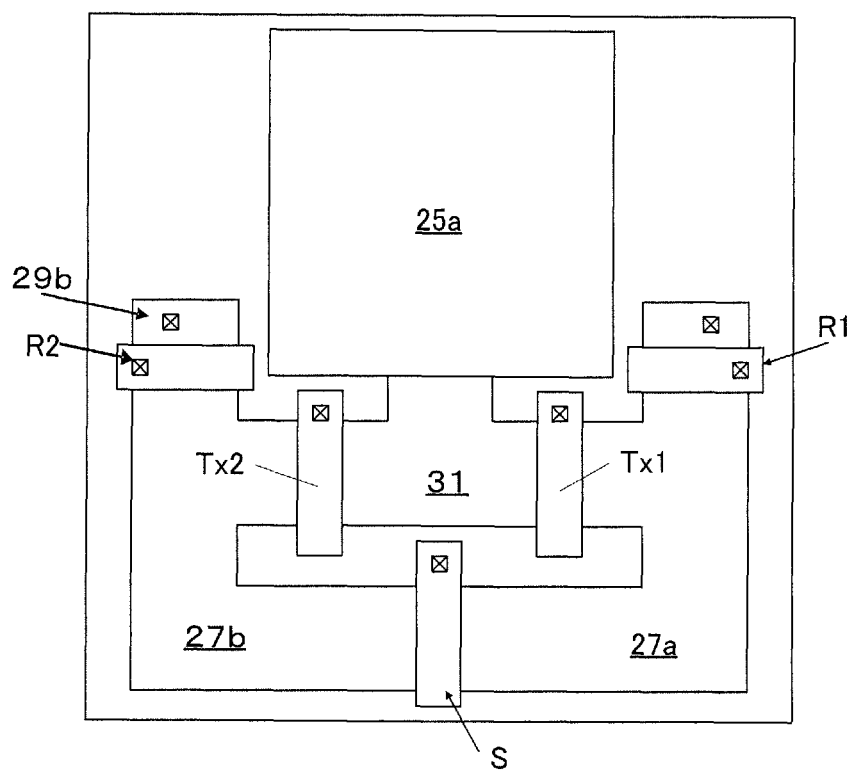
FIG. 30 shows an embodiment provided with a shortage gate for connecting a first charge storage region and a second charge storage region.

FIG. 30 shows another embodiment of this invention. Elements of this another embodiments corresponding to similar elements in the embodiment in FIG. 7 have same reference numbers. In this embodiment, the charge storage regions 27a, 27b are extended to a shortage gate S, so that the charge storage regions 27a and 27b are able to be electrically connected each other. The shortage gate S is configured by a MOS structure gate, as same as the reset gates R1, R2. When the charge storage regions 27a, 27b are reset by opening the reset gates R1, R2, in synchronous with such operations, the shortage gate S is opened to establish electric connection between the charge storage regions 27a and 27b. Thus, according to the reset operation mentioned above, the potential of the charge storage regions 27a, 27b can be reset to an identical potential. In case the reset gate 29a, 29b has different potential, according to the operation of this shortage gate S, the charge at the charge storage regions 29a, 29b can be rest to be identical potential.

FIG. 31 further shows another embodiment of this invention. The elements in this embodiment corresponding to the similar elements in FIG. 30 have the same reference numbers. In this embodiment, the top edges of the extended charge storage regions 27a, 27b are connected to a reset electrode 29 via a gate R/S. This gate R/S works for both of a reset operation and shortage operation. Since the charge storage regions 27a, 27b are commonly reset by the gate R/S, the charge storage regions 27a, 27b can be reset to an identical potential.

FIG. 32 shows an alternative of the embodiment FIG. 31, which includes a common read out portion 41. By configuring the read out portions to be an identical portion, an adjusting operation for adjusting a differential between the performances of the amplifiers to measure an accurate differential is not required. As another alternative, the above mentioned transfer gate and the drain gate may be adapted to the embodiments in FIGS. 31, 32.

While preceding description describes the details of the embodiments of this invention, however, this invention should not be interpreted within these embodiments.

The invention claimed is:

1. An imaging device including a light source emitting light at a given cycle, and a light receiving portion including at least one array of pixel units for performing photoelectric conversion of light in a view field, said imaging device further including a controller performing control so as to accumulate charge generated by photoelectric conversion at exposure cycle synchronous with the light emission of the light source, wherein, said exposure cycle includes a first period for receiving reflection light from a subject illuminated by light from the light source, and a second period for receiving light from the subject illuminated by an environmental light not including the light from the light source, each pixel unit of said imaging device further including a charge transfer portion connected to each of photoelectric conversion regions of the light receiving portion, a first charge storage region for receiving charge generated in said photoelectric conversion region during the first period via said charge transfer portion, and a second charge storage region for receiving charge generated in said photoelectric conversion region during the second period via said charge transfer portion, wherein said charge transfer portion is formed by elongating the photoelectric conversion region and is underneath a blackout curtain that covers the top surface of the array of pixel units, said charge transfer portion being at lower potential than the photoelectric conversion region.

2. The imaging device of claim 1, wherein the first and second charge storage regions are configured to integrate charge generated in the photoelectric conversion regions during n times exposures, said imaging device further including a differential circuit for extracting charges in the first and the second charge storage regions, and for providing a differentiation between said charges, after n times exposures.

3. The imaging device of claim 2, further including means of generating an image not including influence by environmental light, based on said differentiation.

4. The imaging device of claim 2, further including means of calculating a distance to a subject based on phase difference between the signal obtained by the differentiation and the light source.

5. An imaging device including a light source for emitting light at a given cycle, and a light receiving portion including a pixel unit array for receiving light from view,
  said imaging device further including a controller performing control so as to accumulate charge generated by photoelectric conversion at an exposure cycle synchronous with the light emission of the light source,
  wherein, said exposure cycle includes a first period for receiving reflection light from a subject illuminated by light from the light source, and a second period for receiving light from the subject illuminated by an environmental light not including the light from the light source,
  each pixel unit of said imaging device further including a charge transfer portion connected to each of photoelectric conversion regions of the light receiving portion, a first charge storage region for receiving charge generated in said photoelectric conversion region during the first period via said charge transfer portion, and a second charge storage region for receiving charge generated in said photoelectric conversion region during the second period via said charge transfer portion,
  wherein each of the pixel units of the light receiving portion is divided to plural small photoelectric conversion regions, said small photoelectric conversion regions of each of the pixel units are connected to said charge transfer portion in common such that the plural small photoelectric conversion regions compose a single pixel unit.

6. The imaging device of claim 5, wherein said first and second charge storage regions are in common among said small photoelectric conversion regions for each of the pixel units.

7. The imaging device of claim 1, wherein said charge transfer portion is connected to a drain electrode via a drain gate.

8. The imaging device of claim 7, wherein said device is configured to drain charge in said charge transfer portion by opening said drain gate during a rising edge and or a falling edge of the light source.

9. The imaging device of claim 1, wherein said photoelectric conversion region and said charge transfer portion are formed by a buried photo diode structure, each the photoelectric conversion region is connected to the charge transfer portion via the transfer gate.

10. The imaging device of claim 8, wherein said photoelectric conversion region, said charge transfer portion, and said first and second charge storage regions are formed by a buried photo diode structure.

11. The imaging device of claim 1, wherein a micro lens is provided in front of a receiving surface of the light receiving portion.

12. The imaging device of claim 1, wherein said charge storage region is formed by a MOS capacitor and is connected to said charge transfer portion via the transfer gate.

13. The imaging device of claim 1, wherein a read out charge storage region is provided adjacent to said charge storage region via a gate.

14. The imaging device of claim 1, further including a first and a second reset gates to cause each of the first and the second charge storage regions to be at reset potential, and, a shortage gate to establish electrical connection between the first and the second charge storage regions,
  wherein,
    said shortage gate is turned on when the reset gates are turned on so that the first charge storage region and the second charge storage region are at a same potential.

15. The imaging device of claim 1, further including a common reset gate to render the first and the second charge storage regions to connect to a reset potential.

* * * * *